(12) United States Patent
Smith et al.

(10) Patent No.: US 9,305,610 B2
(45) Date of Patent: *Apr. 5, 2016

(54) APPARATUS, SYSTEM, AND METHOD FOR POWER REDUCTION MANAGEMENT IN A STORAGE DEVICE

(71) Applicant: SanDisk Technologies, Inc., Plano, TX (US)

(72) Inventors: Lance L. Smith, San Jose, CA (US);
Jeremy Fillingim, Salt Lake City, UT (US); David Flynn, Sandy, UT (US);
Bill Inskeep, West Valley City, UT (US);
John Strasser, Syracuse, UT (US);
Jonathan Thatcher, Liberty Lake, WA (US)

(73) Assignee: SanDisk Technologies, Inc., Plano, TX (US)

( * ) Notice: Subject to any disclaimer, the term of this patent is extended or adjusted under 35 U.S.C. 154(b) by 322 days.

This patent is subject to a terminal disclaimer.

(21) Appl. No.: 13/652,427

(22) Filed: Oct. 15, 2012

(65) Prior Publication Data

US 2013/0039141 A1    Feb. 14, 2013

Related U.S. Application Data

(63) Continuation of application No. 12/878,981, filed on Sep. 9, 2010, now Pat. No. 8,289,801.

(60) Provisional application No. 61/240,991, filed on Sep. 9, 2009, provisional application No. 61/245,622, filed on Sep. 24, 2009, provisional application No. 61/368,564, filed on Jul. 28, 2010.

(51) Int. Cl.
*G11C 5/14* (2006.01)
*G11C 16/10* (2006.01)
(Continued)

(52) U.S. Cl.
CPC ........ *G11C 5/141* (2013.01); *G06F 1/30* (2013.01); *G06F 11/1048* (2013.01);
(Continued)

(58) Field of Classification Search
CPC .................................................. G11C 11/4072
USPC .................................... 365/228, 229; 714/14
See application file for complete search history.

(56) References Cited

U.S. PATENT DOCUMENTS 4,980,861 A    12/1990    Herdt et al.
5,193,184 A    3/1993     Belsan et al.
(Continued)

FOREIGN PATENT DOCUMENTS

CN    1771495    5/2006
EP    0747822    12/1996
(Continued)

OTHER PUBLICATIONS

Application No. 201080050702.0, 2380.2.34CN1, Office Action, Feb. 20, 2014.
(Continued)

*Primary Examiner* — Vu Le
(74) *Attorney, Agent, or Firm* — Kunzler Law Group, PC

(57) ABSTRACT

An apparatus, system, and method are disclosed for power reduction management. The method includes determining that a power source has failed to supply electric power above a predefined threshold. The method includes terminating one or more non-essential in-process operations on a nonvolatile memory device during a power hold-up time. The method includes executing one or more essential in-process operations on the nonvolatile memory device within the power hold-up time.

25 Claims, 9 Drawing Sheets

(51) Int. Cl.
*G11C 16/30* (2006.01)
*G06F 1/30* (2006.01)
*G06F 11/14* (2006.01)
*G06F 11/30* (2006.01)
*G06F 11/10* (2006.01)
*G06F 11/20* (2006.01)

(52) U.S. Cl.
CPC ....... *G06F 11/1441* (2013.01); *G06F 11/3034* (2013.01); *G11C 16/10* (2013.01); *G11C 16/30* (2013.01); *G06F 11/1076* (2013.01); *G06F 11/1471* (2013.01); *G06F 11/2015* (2013.01); *G06F 11/3058* (2013.01); *G06F 2201/81* (2013.01)

(56) References Cited

U.S. PATENT DOCUMENTS

| | | |
|---|---|---|
| 5,261,068 A | 11/1993 | Gaskins et al. |
| 5,325,509 A | 6/1994 | Lautzenheiser |
| 5,404,485 A | 4/1995 | Ban |
| 5,438,671 A | 8/1995 | Miles |
| 5,504,882 A | 4/1996 | Chai |
| 5,535,399 A | 7/1996 | Blitz |
| 5,548,757 A | 8/1996 | Matsuyama |
| 5,553,261 A | 9/1996 | Hasbun et al. |
| 5,594,883 A | 1/1997 | Pricer |
| 5,598,370 A | 1/1997 | Niijima et al. |
| 5,638,289 A * | 6/1997 | Yamada et al. ............. 307/64 |
| 5,651,133 A | 7/1997 | Burkes |
| 5,682,497 A | 10/1997 | Robinson |
| 5,682,499 A | 10/1997 | Bakke et al. |
| 5,701,434 A | 12/1997 | Nakagawa |
| 5,721,874 A | 2/1998 | Carnevale |
| 5,742,787 A | 4/1998 | Talreja |
| 5,754,563 A | 5/1998 | White |
| 5,799,140 A | 8/1998 | Niijima et al. |
| 5,799,200 A | 8/1998 | Brant et al. |
| 5,802,602 A | 9/1998 | Rahman et al. |
| 5,805,501 A | 9/1998 | Shiau et al. |
| 5,845,329 A | 12/1998 | Onishi et al. |
| 5,960,462 A | 9/1999 | Solomon et al. |
| 6,000,019 A | 12/1999 | Dykstal et al. |
| 6,014,724 A | 1/2000 | Jennett |
| 6,125,072 A | 9/2000 | Wu |
| 6,148,377 A | 11/2000 | Carter et al. |
| 6,170,039 B1 | 1/2001 | Kishida |
| 6,170,047 B1 | 1/2001 | Dye |
| 6,173,381 B1 | 1/2001 | Dye |
| 6,185,654 B1 | 2/2001 | Van Doren |
| 6,205,521 B1 | 3/2001 | Schumann |
| 6,236,593 B1 | 5/2001 | Hong et al. |
| 6,240,040 B1 | 5/2001 | Akaogi et al. |
| 6,256,642 B1 | 7/2001 | Krueger et al. |
| 6,278,633 B1 | 8/2001 | Wong et al. |
| 6,295,571 B1 | 9/2001 | Scardamalia et al. |
| 6,295,581 B1 | 9/2001 | DeRoo |
| 6,330,688 B1 | 12/2001 | Brown |
| 6,336,174 B1 | 1/2002 | Li et al. |
| 6,356,986 B1 | 3/2002 | Solomon et al. |
| 6,370,631 B1 | 4/2002 | Dye |
| 6,385,688 B1 | 5/2002 | Mills |
| 6,385,710 B1 | 5/2002 | Goldman et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,467,011 B2 | 10/2002 | Scardamalia et al. |
| 6,470,238 B1 | 10/2002 | Nizar et al. |
| 6,507,911 B1 | 1/2003 | Langford |
| 6,515,909 B1 | 2/2003 | Wooldridge |
| 6,515,928 B2 | 2/2003 | Sato et al. |
| 6,523,102 B1 | 2/2003 | Dye et al. |
| 6,552,955 B1 | 4/2003 | Miki |
| 6,564,285 B1 | 5/2003 | Mills |
| 6,587,915 B1 | 7/2003 | Kim |
| 6,601,211 B1 | 7/2003 | Norman |
| 6,608,793 B2 | 8/2003 | Park et al. |
| 6,625,685 B1 | 9/2003 | Cho et al. |
| 6,629,112 B1 | 9/2003 | Shank |
| 6,633,950 B1 | 10/2003 | Brown et al. |
| 6,633,956 B1 | 10/2003 | Mitani |
| 6,643,181 B2 | 11/2003 | Sofer et al. |
| 6,658,438 B1 | 12/2003 | Moore et al. |
| 6,671,757 B1 | 12/2003 | Multer et al. |
| 6,694,453 B1 | 2/2004 | Shukla et al. |
| 6,715,027 B2 | 3/2004 | Kim et al. |
| 6,715,046 B1 | 3/2004 | Shoham et al. |
| 6,735,546 B2 | 5/2004 | Scheuerlein |
| 6,751,155 B2 | 6/2004 | Gorobets |
| 6,754,774 B2 | 6/2004 | Gruner et al. |
| 6,760,806 B2 | 7/2004 | Jeon |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,845,053 B2 | 1/2005 | Chevallier |
| 6,849,480 B1 | 2/2005 | Low et al. |
| 6,865,657 B1 | 3/2005 | Traversat et al. |
| 6,871,257 B2 | 3/2005 | Conley et al. |
| 6,877,076 B1 | 4/2005 | Cho et al. |
| 6,880,049 B2 | 4/2005 | Gruner et al. |
| 6,883,079 B1 | 4/2005 | Priborsky |
| 6,887,058 B2 | 5/2005 | Fujiwara |
| 6,892,298 B2 | 5/2005 | West |
| 6,938,133 B2 | 8/2005 | Johnson et al. |
| 6,957,158 B1 | 10/2005 | Hancock et al. |
| 6,959,369 B1 | 10/2005 | Ashton et al. |
| 6,973,551 B1 | 12/2005 | Walton |
| 6,977,847 B2 | 12/2005 | Lasser et al. |
| 6,981,070 B1 | 12/2005 | Luk et al. |
| 6,990,547 B2 | 1/2006 | Ulrich et al. |
| 6,996,676 B2 | 2/2006 | Megiddo |
| 7,010,652 B2 | 3/2006 | Piccirillo et al. |
| 7,042,664 B2 | 5/2006 | Gill et al. |
| 7,043,599 B1 | 5/2006 | Ware et al. |
| 7,050,337 B2 | 5/2006 | Iwase et al. |
| 7,057,936 B2 | 6/2006 | Yaegashi et al. |
| 7,058,769 B1 | 6/2006 | Danilak |
| 7,064,994 B1 | 6/2006 | Wu |
| 7,089,391 B2 | 8/2006 | Geiger et al. |
| 7,096,321 B2 | 8/2006 | Modha |
| 7,107,480 B1 | 9/2006 | Moshayedi et al. |
| 7,167,944 B1 | 1/2007 | Estakhri |
| 7,167,953 B2 | 1/2007 | Megiddo et al. |
| 7,173,852 B2 | 2/2007 | Gorobets |
| 7,177,197 B2 | 2/2007 | Cernea |
| 7,181,572 B2 | 2/2007 | Walmsley |
| 7,185,162 B1 | 2/2007 | Snyder |
| 7,194,577 B2 | 3/2007 | Johnson et al. |
| 7,194,740 B1 | 3/2007 | Frank et al. |
| 7,215,580 B2 | 5/2007 | Gorobets |
| 7,219,238 B2 | 5/2007 | Saito et al. |
| 7,227,777 B2 | 6/2007 | Roohparvar |
| 7,243,203 B2 | 7/2007 | Scheuerlein |
| 7,246,179 B2 | 7/2007 | Camara et al. |
| 7,256,641 B2 | 8/2007 | Namekawa |
| 7,257,129 B2 | 8/2007 | Lee et al. |
| 7,257,690 B1 | 8/2007 | Baird |
| 7,263,591 B2 | 8/2007 | Estakhri et al. |
| 7,275,135 B2 | 9/2007 | Coulson |
| 7,305,520 B2 | 12/2007 | Voight et al. |
| 7,310,711 B2 | 12/2007 | New et al. |
| 7,328,307 B2 | 2/2008 | Hoogterp |
| 7,340,558 B2 | 3/2008 | Lee et al. |
| 7,340,566 B2 | 3/2008 | Voth |
| 7,340,581 B2 | 3/2008 | Gorobets et al. |
| 7,380,081 B2 | 5/2008 | Ji et al. |
| 7,398,348 B2 | 7/2008 | Moore et al. |
| 7,400,537 B2 | 7/2008 | Hemink et al. |
| 7,403,424 B2 | 7/2008 | Hemink et al. |
| 7,424,593 B2 | 9/2008 | Estakhri et al. |
| 7,441,090 B2 | 10/2008 | Estakhri et al. |
| 7,450,420 B2 | 11/2008 | Sinclair et al. |
| 7,451,344 B1 | 11/2008 | Rothberg |
| 7,457,166 B2 | 11/2008 | Hemink et al. |

(56) References Cited

U.S. PATENT DOCUMENTS

| | | |
|---|---|---|
| 7,460,432 B2 | 12/2008 | Warner |
| 7,463,521 B2 | 12/2008 | Li |
| 7,463,532 B2 | 12/2008 | Tran et al. |
| 7,464,240 B2 | 12/2008 | Caulkins et al. |
| 7,480,766 B2 | 1/2009 | Gorobets |
| 7,487,320 B2 | 2/2009 | Bansal et al. |
| 7,495,954 B2 | 2/2009 | Ito |
| 7,499,317 B2 | 3/2009 | Ito |
| 7,499,338 B2 | 3/2009 | Ito |
| 7,522,457 B2 | 4/2009 | Hemink et al. |
| 7,532,537 B2 | 5/2009 | Solomon et al. |
| 7,535,766 B2 | 5/2009 | Ito |
| 7,552,271 B2 | 6/2009 | Sinclair et al. |
| 7,599,967 B2 | 10/2009 | Girkar et al. |
| 7,619,912 B2 | 11/2009 | Bhakta et al. |
| 7,630,255 B2 | 12/2009 | Yang |
| 7,631,138 B2 | 12/2009 | Gonzalez et al. |
| 7,644,239 B2 | 1/2010 | Ergan et al. |
| 7,652,922 B2 | 1/2010 | Kim |
| 7,725,628 B1 | 5/2010 | Phan et al. |
| 7,743,210 B1 | 6/2010 | Jernigan, IV et al. |
| 7,752,360 B2 | 7/2010 | Galles |
| 7,761,625 B2 | 7/2010 | Karamcheti et al. |
| 7,773,521 B2 | 8/2010 | Zhang et al. |
| 7,777,652 B2 | 8/2010 | Lee et al. |
| 7,778,092 B2 | 8/2010 | Klein |
| 7,856,528 B1 | 12/2010 | Frost et al. |
| 7,873,782 B2 | 1/2011 | Terry |
| 7,881,150 B2 | 2/2011 | Solomon et al. |
| 7,908,501 B2 | 3/2011 | Kim et al. |
| 7,930,326 B2 | 4/2011 | Doucette et al. |
| 7,944,762 B2 | 5/2011 | Gorobets |
| 7,970,770 B2 | 6/2011 | Edwards |
| 8,001,334 B2 | 8/2011 | Lee |
| 8,001,434 B1 | 8/2011 | Lee et al. |
| 8,010,738 B1 | 8/2011 | Chilton et al. |
| 8,046,551 B1 | 10/2011 | Sahin |
| 8,055,922 B2 | 11/2011 | Brittain et al. |
| 8,074,041 B2 | 12/2011 | Clark |
| 8,081,536 B1 | 12/2011 | Solomon et al. |
| 8,130,551 B2 | 3/2012 | Oowada et al. |
| 8,250,295 B2 | 8/2012 | Amidi et al. |
| 8,289,801 B2 * | 10/2012 | Smith et al. .................... 365/228 |
| 8,301,833 B1 | 10/2012 | Chen et al. |
| 8,359,501 B1 | 1/2013 | Lee et al. |
| 8,364,888 B2 | 1/2013 | Melik-Martirosian et al. |
| 8,423,710 B1 | 4/2013 | Gole |
| 8,429,436 B2 | 4/2013 | Fillingim et al. |
| 8,516,185 B2 | 8/2013 | Lee et al. |
| 8,516,187 B2 | 8/2013 | Chen et al. |
| 8,549,230 B1 | 10/2013 | Chatterjee et al. |
| 2002/0066047 A1 | 5/2002 | Olarig et al. |
| 2002/0069318 A1 | 6/2002 | Chow et al. |
| 2002/0103819 A1 | 8/2002 | Duvillier |
| 2002/0133743 A1 | 9/2002 | Oldfield |
| 2002/0138686 A1 | 9/2002 | Yang et al. |
| 2002/0181134 A1 | 12/2002 | Bunker et al. |
| 2002/0199056 A1 | 12/2002 | Ayukawa et al. |
| 2003/0028704 A1 | 2/2003 | Mukaida |
| 2003/0028726 A1 | 2/2003 | Gaertner et al. |
| 2003/0061296 A1 | 3/2003 | Craddock et al. |
| 2003/0115405 A1 | 6/2003 | Funyu et al. |
| 2003/0126475 A1 | 7/2003 | Bodas |
| 2003/0145230 A1 | 7/2003 | Chiu et al. |
| 2003/0163630 A1 | 8/2003 | Aasheim et al. |
| 2003/0163663 A1 | 8/2003 | Aasheim et al. |
| 2003/0198084 A1 | 10/2003 | Fujisawa et al. |
| 2003/0210601 A1 | 11/2003 | Lin et al. |
| 2004/0003002 A1 | 1/2004 | Adelmann |
| 2004/0064647 A1 | 4/2004 | DeWhitt et al. |
| 2004/0103238 A1 | 5/2004 | Avraham et al. |
| 2004/0148360 A1 | 7/2004 | Mehra et al. |
| 2004/0177054 A1 | 9/2004 | Stern et al. |
| 2004/0186946 A1 | 9/2004 | Lee |
| 2004/0225719 A1 | 11/2004 | Kisley et al. |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0141313 A1 | 6/2005 | Gorobets |
| 2005/0144361 A1 | 6/2005 | Gonzalez |
| 2005/0172099 A1 | 8/2005 | Lowe |
| 2005/0193166 A1 | 9/2005 | Johnson et al. |
| 2005/0210323 A1 | 9/2005 | Batchelor et al. |
| 2005/0216653 A1 | 9/2005 | Aasheim et al. |
| 2005/0240713 A1 | 10/2005 | Wu |
| 2005/0246510 A1 | 11/2005 | Retnamma et al. |
| 2005/0246558 A1 | 11/2005 | Ku |
| 2005/0257017 A1 | 11/2005 | Yagi |
| 2005/0257213 A1 | 11/2005 | Chu et al. |
| 2005/0262150 A1 | 11/2005 | Krishnaswamy |
| 2005/0267882 A1 | 12/2005 | Aupperlee et al. |
| 2005/0270927 A1 | 12/2005 | Hayashi |
| 2005/0273476 A1 | 12/2005 | Wertheimer |
| 2006/0004955 A1 | 1/2006 | Ware et al. |
| 2006/0020744 A1 | 1/2006 | Sinclair |
| 2006/0026221 A1 | 2/2006 | Chen et al. |
| 2006/0059326 A1 | 3/2006 | Aasheim et al. |
| 2006/0064556 A1 | 3/2006 | Aasheim et al. |
| 2006/0069870 A1 | 3/2006 | Nicholson et al. |
| 2006/0074877 A1 | 4/2006 | Kuersch et al. |
| 2006/0075057 A1 | 4/2006 | Gildea et al. |
| 2006/0085471 A1 | 4/2006 | Rajan et al. |
| 2006/0095659 A1 | 5/2006 | New et al. |
| 2006/0106990 A1 | 5/2006 | Benhase et al. |
| 2006/0117056 A1 | 6/2006 | Havewala et al. |
| 2006/0136464 A1 | 6/2006 | Rossmann |
| 2006/0136779 A1 | 6/2006 | Lee et al. |
| 2006/0139069 A1 | 6/2006 | Frank et al. |
| 2006/0149893 A1 | 7/2006 | Barfuss et al. |
| 2006/0149916 A1 | 7/2006 | Nase |
| 2006/0179263 A1 | 8/2006 | Song et al. |
| 2006/0184722 A1 | 8/2006 | Sinclair |
| 2006/0184736 A1 | 8/2006 | Benhase et al. |
| 2006/0190552 A1 | 8/2006 | Henze et al. |
| 2006/0212644 A1 | 9/2006 | Acton et al. |
| 2006/0230295 A1 | 10/2006 | Schumacher et al. |
| 2006/0248387 A1 | 11/2006 | Nicholson et al. |
| 2006/0265624 A1 | 11/2006 | Moshayedi et al. |
| 2006/0265635 A1 | 11/2006 | Tokita et al. |
| 2006/0265636 A1 | 11/2006 | Hummler |
| 2006/0280048 A1 | 12/2006 | Jung et al. |
| 2006/0294300 A1 | 12/2006 | Lubbers |
| 2007/0016699 A1 | 1/2007 | Minami |
| 2007/0033325 A1 | 2/2007 | Sinclair |
| 2007/0033326 A1 | 2/2007 | Sinclair |
| 2007/0033327 A1 | 2/2007 | Sinclair |
| 2007/0033362 A1 | 2/2007 | Sinclair |
| 2007/0043900 A1 | 2/2007 | Yun |
| 2007/0050571 A1 | 3/2007 | Nakamura |
| 2007/0061508 A1 | 3/2007 | Zweighaft |
| 2007/0083530 A1 | 4/2007 | Lakshminath et al. |
| 2007/0086260 A1 | 4/2007 | Sinclair |
| 2007/0088666 A1 | 4/2007 | Saito |
| 2007/0118713 A1 | 5/2007 | Guterman |
| 2007/0143560 A1 | 6/2007 | Gorobets |
| 2007/0143566 A1 | 6/2007 | Gorobets |
| 2007/0147356 A1 | 6/2007 | Gorobets |
| 2007/0156998 A1 | 7/2007 | Gorobets |
| 2007/0168641 A1 | 7/2007 | Hummel et al. |
| 2007/0168698 A1 | 7/2007 | Coulson et al. |
| 2007/0174574 A1 | 7/2007 | Kano |
| 2007/0198770 A1 | 8/2007 | Horii et al. |
| 2007/0204270 A1 | 8/2007 | Shin |
| 2007/0208790 A1 | 9/2007 | Reuter et al. |
| 2007/0220227 A1 | 9/2007 | Long |
| 2007/0230253 A1 | 10/2007 | Kim |
| 2007/0233937 A1 | 10/2007 | Coulson et al. |
| 2007/0233938 A1 | 10/2007 | Cho et al. |
| 2007/0234021 A1 | 10/2007 | Ruberg et al. |
| 2007/0239728 A1 | 10/2007 | Smits |
| 2007/0239926 A1 | 10/2007 | Gyl et al. |
| 2007/0245076 A1 | 10/2007 | Chang et al. |
| 2007/0245094 A1 | 10/2007 | Lee et al. |

(56) References Cited

U.S. PATENT DOCUMENTS

| | | |
|---|---|---|
| 2007/0260608 A1 | 11/2007 | Hertzberg et al. |
| 2007/0260813 A1 | 11/2007 | Lin |
| 2007/0260821 A1 | 11/2007 | Zeffer et al. |
| 2007/0266037 A1 | 11/2007 | Terry |
| 2007/0274150 A1 | 11/2007 | Gorobets |
| 2007/0276994 A1 | 11/2007 | Caulkins et al. |
| 2007/0300008 A1 | 12/2007 | Rogers et al. |
| 2008/0010395 A1 | 1/2008 | Mylly et al. |
| 2008/0025126 A1 | 1/2008 | Jewell et al. |
| 2008/0052477 A1 | 2/2008 | Lee |
| 2008/0052483 A1 | 2/2008 | Rangarajan et al. |
| 2008/0059820 A1 | 3/2008 | Vaden et al. |
| 2008/0080243 A1 | 4/2008 | Edahiro et al. |
| 2008/0104344 A1 | 5/2008 | Shimozono et al. |
| 2008/0117686 A1 | 5/2008 | Yamada |
| 2008/0126507 A1 | 5/2008 | Wilkinson |
| 2008/0126686 A1 | 5/2008 | Sokolov et al. |
| 2008/0140737 A1 | 6/2008 | Garst et al. |
| 2008/0141043 A1 | 6/2008 | Flynn et al. |
| 2008/0162590 A1 | 7/2008 | Kundu et al. |
| 2008/0228992 A1 | 9/2008 | Dumitru et al. |
| 2008/0243966 A1 | 10/2008 | Croisettier et al. |
| 2008/0256316 A1 | 10/2008 | Evanchik et al. |
| 2008/0263259 A1 | 10/2008 | Sadovsky et al. |
| 2008/0263305 A1 | 10/2008 | Shu et al. |
| 2008/0263569 A1 | 10/2008 | Shu et al. |
| 2008/0266973 A1 | 10/2008 | Sekar et al. |
| 2008/0282031 A1 | 11/2008 | Tanoue |
| 2008/0301475 A1 | 12/2008 | Felter et al. |
| 2008/0320323 A1 | 12/2008 | Brittain et al. |
| 2009/0031072 A1* | 1/2009 | Sartore .................. 711/102 |
| 2009/0031098 A1 | 1/2009 | Sartore |
| 2009/0037778 A1 | 2/2009 | Resnick |
| 2009/0091979 A1 | 4/2009 | Shalvi |
| 2009/0091996 A1 | 4/2009 | Chen et al. |
| 2009/0094676 A1 | 4/2009 | Burugula et al. |
| 2009/0106479 A1 | 4/2009 | Okin et al. |
| 2009/0125700 A1 | 5/2009 | Kisel |
| 2009/0144818 A1 | 6/2009 | Kumar et al. |
| 2009/0150599 A1 | 6/2009 | Bennett |
| 2009/0150605 A1 | 6/2009 | Flynn et al. |
| 2009/0150621 A1 | 6/2009 | Lee |
| 2009/0157989 A1 | 6/2009 | Karamcheti et al. |
| 2009/0172253 A1 | 7/2009 | Rothman et al. |
| 2009/0193183 A1 | 7/2009 | Kudo et al. |
| 2009/0204649 A1 | 8/2009 | Wong et al. |
| 2009/0207649 A1 | 8/2009 | Tang et al. |
| 2009/0239468 A1 | 9/2009 | He et al. |
| 2009/0248763 A1 | 10/2009 | Rajan |
| 2009/0276654 A1 | 11/2009 | Butterworth |
| 2009/0287887 A1 | 11/2009 | Matsuki |
| 2009/0292861 A1 | 11/2009 | Kanevsky et al. |
| 2010/0005228 A1 | 1/2010 | Fukutomi |
| 2010/0023682 A1 | 1/2010 | Lee et al. |
| 2010/0049913 A1 | 2/2010 | Alon et al. |
| 2010/0082529 A1 | 4/2010 | Mace et al. |
| 2010/0095059 A1 | 4/2010 | Kisley et al. |
| 2010/0102999 A1 | 4/2010 | Lee et al. |
| 2010/0106917 A1 | 4/2010 | Ruberg et al. |
| 2010/0110748 A1 | 5/2010 | Best |
| 2010/0122017 A1 | 5/2010 | Toyama |
| 2010/0146187 A1 | 6/2010 | Grimsrud et al. |
| 2010/0153680 A1 | 6/2010 | Baum et al. |
| 2010/0199020 A1 | 8/2010 | Lin et al. |
| 2010/0205335 A1 | 8/2010 | Phan et al. |
| 2010/0211737 A1 | 8/2010 | Flynn |
| 2010/0228936 A1 | 9/2010 | Wright et al. |
| 2010/0250831 A1 | 9/2010 | O'Brien et al. |
| 2010/0257304 A1 | 10/2010 | Rajan et al. |
| 2010/0262738 A1 | 10/2010 | Swing et al. |
| 2010/0262740 A1 | 10/2010 | Borchers et al. |
| 2010/0262757 A1 | 10/2010 | Sprinkle et al. |
| 2010/0262758 A1 | 10/2010 | Swing et al. |
| 2010/0262759 A1 | 10/2010 | Borchers et al. |
| 2010/0262760 A1 | 10/2010 | Swing et al. |
| 2010/0262761 A1 | 10/2010 | Borchers et al. |
| 2010/0262762 A1 | 10/2010 | Borchers et al. |
| 2010/0262766 A1 | 10/2010 | Sprinkle et al. |
| 2010/0262767 A1 | 10/2010 | Borchers et al. |
| 2010/0262773 A1 | 10/2010 | Borchers et al. |
| 2010/0262894 A1 | 10/2010 | Swing et al. |
| 2010/0262979 A1 | 10/2010 | Borchers et al. |
| 2010/0268974 A1 | 10/2010 | Floyd et al. |
| 2010/0287347 A1 | 11/2010 | Cameron et al. |
| 2010/0332871 A1 | 12/2010 | Allalouf et al. |
| 2010/0332897 A1 | 12/2010 | Wilson |
| 2011/0004722 A1 | 1/2011 | Jeddeloh |
| 2011/0035562 A1 | 2/2011 | Gaither |
| 2011/0208911 A1 | 8/2011 | Taguchi et al. |
| 2011/0225364 A1 | 9/2011 | Edwards |
| 2012/0030408 A1 | 2/2012 | Flynn et al. |
| 2012/0096217 A1 | 4/2012 | Son et al. |
| 2012/0151118 A1 | 6/2012 | Flynn et al. |
| 2012/0239860 A1 | 9/2012 | Atkisson et al. |
| 2012/0254515 A1 | 10/2012 | Melik-Martirosian et al. |
| 2014/0365707 A1 | 12/2014 | Talagala et al. |
| 2015/0248922 A1 | 9/2015 | Hyun et al. |

FOREIGN PATENT DOCUMENTS

| | | |
|---|---|---|
| GB | 0123416.0 | 9/2001 |
| JP | 10320270 | 12/1998 |
| KR | 1020000026300 | 5/2000 |
| KR | 1020010034476 | 4/2001 |
| KR | 1020050024278 | 3/2005 |
| KR | 1020060107728 | 10/2006 |
| TW | 200825696 | 6/2008 |
| WO | 0131512 | 5/2001 |
| WO | 0101365 | 1/2002 |
| WO | 2004077219 | 9/2004 |
| WO | 2004099989 | 11/2004 |
| WO | 2005103878 | 11/2005 |
| WO | 2006062511 | 6/2006 |
| WO | 2006065626 | 6/2006 |
| WO | 2008130799 | 3/2008 |
| WO | 2008070799 | 6/2008 |
| WO | 2010053756 | 5/2010 |
| WO | 2011106394 | 9/2011 |
| WO | 2012050934 | 4/2012 |
| WO | 2012082792 | 6/2012 |

OTHER PUBLICATIONS

U.S. Appl. No. 13/834,955, Final Office Action, Sep. 8, 2014.
Shibata, Noboru, "19nm 112.8mm 64Gb Multi-Level Flash Memory with 400Mb/s/pin 1.8V Toggle Mode Interface", Flash Memory Summit 2012, Santa Clara, California, US.
Application No. PCT/US2012/024927, P201102PCT, International Preliminary Report on Patentability, Aug. 22, 2013.
Application No. PCT/US2012/024927, P201102PCT, International Search Report, Oct. 16, 2012.
Application No. PCT/US2012/024927, P201102PCT, Written Opinion, Oct. 12, 2012.
Agrawal, Vikas, "ECC and Signal Processing Technology for SSDs and Multi-bit per cell NAND Flash Memories", Forward Insights, 2012, pp. 21, 2nd Edition, Report No. FI-NFL-FSP-0112.
U.S. Appl. No. 13/834,955, Office Action, Apr. 4, 2014.
U.S. Appl. No. 13/372,430, Office Action, Nov. 7, 2013.
U.S. Appl. No. 13/372,430, Office Action, Apr. 21, 2014.
U.S. Appl. No. 13/372,403, Advisory Action, Aug. 6, 2014.
Application No. PCT/US2011/036539, International Preliminary Report on Patentability, Nov. 13, 2012.
Application No. PCT/US2011/045801, International Search Report, Apr. 6, 2012.
Application No. EP11813216, Supplementary European Search Report, Jul. 11, 2013.
Application No. PCT/US2011/065927, International Search Report, Aug. 28, 2012.
U.S. Appl. No. 12/878,987, Notice of Allowance, Mar. 21, 2013.
U.S. Appl. No. 12/878,987, Office Action, Oct. 18, 2012.
U.S. Appl. No. 60/625,495, Provisional, Nov. 6, 2004.

(56) References Cited

OTHER PUBLICATIONS

U.S. Appl. No. 60/718,768, Provisional, Aug. 20, 2005.
U.S. Appl. No. 60/797,127, Provisional, May 3, 2006.
Macko, Peter, "Tracking Back References in Write-Anywhere File System", 8th USENIX Conference on File and Storage Technologies, Feb. 23-26, 2010, pp. 15, San Jose, California, US.
Application No. 10816108.4, PCT/US2010048321, Search Report, Feb. 4, 2014.
PCT/US2007/086687, International Preliminary Report on Patentability, Mar. 18, 2009.
PCT/US2010/048321, International Search Report, Apr. 28, 2011.
PCT/US2010/048320, International Search Report, Apr. 28, 2011.
P201021PCT, Application No. PCT/US2011/064728, International Search Report and Written Opinion, Jul. 31, 2012.
Mellor, Chris, "New RAM Shunts Data Into Flash in Power Cuts", The Channel, Oct. 19, 2011, p. 1, http://www.channelregister.co.uk/2011/10/19/viing_hybrid_dram_nand/.
U.S. Appl. No. 12/878,981, Notice of Allowance, Aug. 28, 2012.
AgigaRAM Company, Technology Review, Feb. 2008, p. 1, reviewed Feb. 17, 2010.
"Agiga Tech Introduction", Agigaram, San Diego, California, US, Mar. 7, 2013.
"Finding the Perfect Memory", Agiga Tech, White Paper, Sep. 3, 2009, p. 15, Poway, California, US.
"Bulletproof Memory for RAID Servers, Part 1", Agiga Tech, 2009, pp. 4, http://agigatech.com/blog/bulletproof-memory-for-raid-servers-part-1/.
Ajanovic, Jasmin, "PCI Express* (PCIe*) 3.0 Accelerator Features", Intel Corporation, pp. 10, Mar. 7, 2013.
Malventano, Allyn, "DDRdrive Hits the Ground Running—PCI-E RAM-based SSD", PC Perspective, May 4, 2009, pp. 2, http://www.pcper.com/article.phpaid=704.
Hutsell, Woody, "An In-depth Look at the RamSan-500 Cached Flash Solid State Disk", Texas Memory Systems, White Paper, Mar. 2008, pp. 16.
Shrout, Ryan, "Gigabyte iRAM Solid State SATA Storage Review", PC Perspective, Apr. 5, 2006, pp. 2, http://www.pcper.com/article.php?aid=224&type=expert.
Wu, Michael, "eNVy: A Non-Volatile, Main Memory Storage System", Association of Computing Machinery, 1994, pp. 12, 0-89791-660-3/94/0010, San Jose, California, US.
Lottiaux, Renaud, "OpenMosix, OpenSSI and Kerrighed: A Comparative Study", INRIA Institut National De Recherche en Informatique et en Automatique, Nov. 2004, pp. 23, No. 5399.
"(Take 2): Transcendent Memory ("tmem") for Linux", LWN Merchandise, 2009, pp. 3, http://lwn.net/Articles/340409/.
Rose, Mike, "FPGA PCIe Bandwidth", University of California San Diego, Jun. 9, 2010, pp. 7, Department of Computer Science and Engineering.
Condit, Jeremy, "Better I/O Through Byte-Addressable, Persistent Memory", Microsoft Research, UCLA, Oct. 11-14, 2009, pp. 14, ACM 978-1-60558-752-3/09/10, Big Sky, Montana, US.
"NAND Flash 101: An Introduction to NAND Flash and How to Design It in to Your Next Product", Micron Technical Note, 2006, pp. 28, TN-29-19: *NAND Flash 101 NAND vs. NOR Comparison*.
"Pivot3 RAIGE Storage Cluster", Pivot3 White Paper, Jun. 2007, pp. 17, Technology Overview.
Application No. 200780050983.8, Office Action, May 18, 2011.
Application No. 07865334.2, Office Action, Dec. 10, 2010.
"Information Technology—SCSI Object-Based Storage Device Commands (OSD)", Seagate Technology, Jul. 30, 2004, pp. 187, Project T10/1355-D, Revision 10.
Application No. 07865334.2, Office Action, Jan. 30, 2012.
U.S. Appl. No. 11/952,109, Office Action, Mar. 17, 2011.
U.S. Appl. No. 11/952,109, Office Action, Jul. 1, 2011.
Application No. 200780050970.0, Office Action, Oct. 28, 2010.
Application No. 200780050970.0, Office Action, Jun. 29, 2011.
Application No. 200780050970.0, Office Action, Jan. 5, 2012.
U.S. Appl. No. 11/952,113, Office Action, Dec. 15, 2010.
Application No. 200780051020.X, Office Action, Nov. 11, 2010.
Application No. 200780051020.X, Office Action, Jul. 6, 2011.
Application No. 200780051020.X, Nov. 7, 2011.
Application No. 07865345.8, Office Action, Dec. 10, 2010.
Application No. 07865345.8, Office Action, Jan. 30, 2012.
"Actel Fusion FPGAs Supporting Intelligent Peripheral Management Interface (IPMI) Applications", Actel, Oct. 2006, pp. 17, Application Note AC286, Mountain View, California, US.
"Method for Fault Tolerance in Nonvolatile Storage", PriorArtDatabase, Feb. 3, 2005, pp. 6, Technical Disclosure.
Ismail, Ari, "Performance Boosting and Workload Isolation in Storage Area Networks with SANCache", Hewlett Packard Laboratories, May 2006, pp. 11, Proceedings of the 23rd IEEE/14th NASA Goddard Conference on Mass Storage Systems and Technologies (MSST 2006), College Park, Maryland, US.
"ASPMC-660", Asine, downloaded Nov. 18, 2009, pp. 3, http://www.asinegropu.com/products/aspmc660.html.
Brandon, Daniel, Jr., "Sparse Matrices in CS Education", 2009, pp. 6, Consortium for Computing Sciences in Colleges.
Coburn, Joel, "NV-Heaps: Making Persistent Objects Fast and Safe with Next-Generation, Non-Volatile Memories", University of California San Diego, 2011, pp. 13, ACM 978-1-4503-0266.Jan. 11, 2003, Newport Beach, California, US.
"NAND Flash Memories and Programming NAND Flash Memories Using ELNEC Device Programmers", ELNEC, Aug. 2008, pp. 44, Application Note, Version 2.10/08.2008.
Wright, Charles P., "Amino: Extending ACID Semantics to the File System", p. 1, Mar. 7, 2013.
Gal, Eran, "A Transactional Flash File System for Microcontrollers", USENIX Association, 2005, pp. 16, 2005 USENIX Annual Technical Conference.
Garfinkel, Simson L., "One Big File Is Not Enough" A Critical Evaluation of the Dominant Free-Space Sanitization Technique, Harvard University, Jun. 28, 2006, pp. 31.
Gutmann, Peter, "Secure Deletion of Data from Magnetic and Solid-State Memory", University of Auckland, Jul. 22-25, 1996, pp. 18, Sixth USENIX Security Symposium Proceedings, San Jose, California, US.
Dan Raz, "Implementing MLC NAND Flash for Cost-Effective, High-Capacity Memory", M-Systems, Sep. 2003, pp. 13, 91-SR-014-02-8L, Rev 1.1.
Application No. 201080050702.0, Second Office Action, Sep. 19, 2014.
Application No. PCT/US2012/024927, IPRP, Aug. 13, 2013.
Am29DL322D/323D/324D Data Sheet, Spansion, Jul. 2003, pp. 57, Publication No. 21534 Revision D, Amendment +7, Issue Date Oct. 7, 2004.
"Intel Turbo Memory with User Pinning", Intel NAND Storage Solutions, 2008, pp. 4.
"File System Primer", CoolSolutionsWiki, downloaded Oct. 18, 2006, pp. 5, http://wiki.novell.com/index.php/File_System_Primer.
Application No. PCT/US2011/025885, International Preliminary Report on Patentability, Sep. 7, 2012.
Application No. PCT/US2011/025885, International Search Report and Written Opinion, Sep. 28, 2011.
Application No. PCT/US2007/025048, International Search Report and Written Opinion, May 27, 2008.
Application No. PCT/US2007/025048, International Preliminary Report on Patentability, Jun. 18, 2009.
Application No. PCT/US2007/086688, International Search Report and Written Opinion, Apr. 28, 2008.
Application No. PCT/US2007/086688, International Preliminary Report on Patentability, Mar. 16, 2009.
Application No. PCT/US2007/086691, International Search Report and Written Opinion, Aug. 5, 2008.
Application No. PCT/US2007/086691, International Preliminary Report on Patentability, Feb. 16, 2009.
Application No. PCT/US2007/086701, International Search Report and Written Opinion, Jun. 5, 2008.
Application No. PCT/US2007/086701, International Preliminary Report on Patentability, Mar. 16, 2009.

(56) References Cited

OTHER PUBLICATIONS

Plank, James S., "A Tutorial on Reed-Solomon Coding for Fault-Tolerance in RAID-like Systems", University of Tennessee, pp. 19, Technical Report CS-96-332, http://www.cs.utk.edu/plank/papers/CS-03-504.html Mar. 7, 2013.
Porter, Donald E., "Operating System Transactions", The University of Texas at Austin, Oct. 11-14, 2009, pp. 20.
Rosenblum, Mendel, "The Design and Implementation of a Log-Structured File System", ACM, Feb. 1992, pp. 27, vol. 10, No. 1.
"Introduction to Samsung's Linux Flash File System—RFS", Samsung Electronics, Nov. 2006, pp. 6, Application Note, Version 1.0.
Sears, Russell C., "Stasis: Flexible Transactional Storage", University of California at Berkeley, Jan. 8, 2010, pp. 176, Technical Report No. UCB/EECS-2010-2, http://www.eecs.berkeley.edu/Pubs/TechRpts/2010/EECS-2010-2.html.
Seltzer, Margo Ilene, "File System Performance and Transaction Support", University of California at Berkeley, 1983, pp. 131.
Seltzer, Margo Ilene, "Transaction Support in a Log-Structured File System", Harvard University, pp. 8, Mar. 7, 2013.
Seltzer, Margo, "Transaction Support in Read Optimized and Write Optimized File Systems", University of California Berkeley, pp. 12, Mar. 7, 2013.
"Data Management Software (DMS) for AMD Simultaneous Read/Write Flash Memory Devices", Spansion, Jul. 2003, pp. 10, Technology Background, Publication No. 22274, Revision A, Amendment 0.
Spillane, Richard P., "Enabling Transactional File Access via Lightweight Kernel Extensions", Stony Brook University, 2009, pp. 23, Proceedings of the 7th USENIX Conference on File and Storage Technologies.
Tal, Arie, "*NAND* vs. *NOR Flash Technology*", M-Systems, Feb. 1, 2002, pp. 3, http://www.electronicproducts.com/Digital_ICs/NAND_vs_NOR_flash_t.
Van Hensbergen, Eric, "Dynamic Policy Disk Caching for Storage Networking", IBM, Nov. 28, 2006, pp. 13, RC24123 (W0611-189).
Volos, Haris, "Mnemosyne: Lightweight Persistent Memory", ACM, 2011, pp. 13, 978-1-4503-0266-1/11/03.
U.S. Appl. No. 11/952,109, Office Action, Nov. 29, 2011.
U.S. Appl. No. 11/952,109, Office Action, May 1, 2012.
U.S. Appl. No. 11/952,113, Office Action, Mar. 6, 2012.
Morgenstern, David, "Is There a Flash Memory RAID in Your Future?", Ziff Davis Enterprise Holdings, Inc., Nov. 8, 2006, pp. 4, http://www.eweek.com.
Application No. PCT/US2007/086687, International Search Report and Written Opinion, May 9, 2008.
Application No. PCT/US2007/086687, International Preliminary Report on Patentability, Mar. 18, 2009.
Application No. PCT/US2011/053795, International Search Report and Written Opinion, May 4, 2012.
Arpaci-Dusseau, Andrea C., "Removing the Costs of Indirection in Flash-based SSDs with Nameless Writes", Microsoft Research, pp. 5, Mar. 7, 2013.
Leventhal, Adam, "Flash Storage Memory", Communications of the ACM, Jul. 2008, pp. 5, vol. 51, No. 7.
Kawaguchi, Atsuo, "A Flash-Memory Based File System", Hitachi, Ltd., pp. 10, Mar. 7, 2013.
Mesnier, Mike, "Object-Based Storage", IEEE Communication Magazine, Aug. 2003, pp. 7, Storage Area Networking, 0163-6804/03.
U.S. Appl. No. 14/011,395, Final Office Action, May 18, 2015.
U.S. Appl. No. 14/042,189, Office Action, Jun. 4, 2015.
Application No. 2011800598626, Office Action, Apr. 1, 2015.
U.S. Appl. No. 14/011,395, Final Office Action, May 8, 2015.
U.S. Appl. No. 11/952,098, Final Office Action, Sep. 18, 2012.
U.S. Appl. No. 11/952,098, Office Action, Jan. 7, 2011.
U.S. Appl. No. 11/952,098, Office Action, Jan. 13, 2012.
U.S. Appl. No. 11/952,098, Office Action, Oct. 8, 2013.
U.S. Appl. No. 13/174,449, Office Action, Sep. 6, 2011.
U.S. Appl. No. 13/174,449, Office Action, Jun. 30, 2011.
Application No. 07865345.8, Examination Report, Jan. 30, 2012.
Application No. PCT/US2007/086702, International Preliminary Report on Patentability, Nov. 10, 2009.
Application No. PCT/US2007/086702, International Search Report, Nov. 4, 2009.
Application No. PCT/US2007/086702, Written Opinion, Nov. 4, 2009.
Application No. PCT/US2007/025049, International Preliminary Report on Patentability, Mar. 11, 2009.
Application No. PCT/US2007/025049, International Search Report, May 14, 2008.
Application No. PCT/US2007/025049, Written Opinion, May 14, 2008.
U.S. Appl. No. 13/248,006, Notice of Allowance, Nov. 8, 2013.
U.S. Appl. No. 13/248,006, Office Action, Aug. 30, 2013.
Application No. PCT/US2011/053792, International Preliminary Report on Patentability, Apr. 2, 2013.
Application No. PCT/US2011/053792, International Search Report, May 4, 2012.
Application No. PCT/US2011/053792, Written Opinion, May 4, 2012.
U.S. Appl. No. 13/836,826, Notice of Allowance, Jul. 30, 2015.
U.S. Appl. No. 13/836,826, Office Action, Feb. 24, 2015.
Application No. 11848174.6, Examination Report, Jun. 30, 2015.
Application No. 11848174.6, Search Report, Apr. 2, 2014.
U.S. Appl. No. 13/324,942, Notice of Allowance, May 2, 2013.
U.S. Appl. No. 13/694,000, Notice of Allowance, Feb. 4, 2015.
U.S. Appl. No. 13/838,070, Notice of Allowance, Aug. 26, 2015.
Megiddo, Nimrod, "ARC: A Self-Tuning, Low Overhead Replacement Cache", 2nd USENIX Conference on File and Storage Technologies, Mar. 31-Apr. 2, 2003, pp. 17, San Francisco, California, US.
"BiTMICRO Introduces E-Disk PMC Flash Disk Module", BiTMICRO, May 13, 2004, pp. 2, Military & Aerospace Electronics East 2004.
Application No. PCT/US2014/048129, International Search Report and Written Opinion, Nov. 7, 2014.
Coburn, Joel, "From ARIES to MARS: Reengineering Transaction Management for Next-Generation. Solid-State Drives" UCSD CSE Technical Report, downloaded Jul. 11, 2013, pp. 17, San Diego, California, US.
"Internet Backbone and Colocation Provider", Hurricane Electric Internet Services, downloaded Sep. 28, 2011, pp. 1, Fremont, California, US.
U.S. Appl. No. 14/011,395, Final Office Action, Jun. 26, 2014.
Application No. PCT/US2008/059048, International Search Report, Aug. 25, 2008.
Guerra Jorge, "Software Persistent Memory", Florida International University, downloaded Jul. 11, 2013, pp. 13.
Savov, Vlad, "Viking Modular's Satadimm Jacks an SSD Into Your Memory Slot", Aug. 27, 2010, pp. 6.
U.S. Appl. No. 14/011,395, Office Action, Jan. 16, 2014.
U.S. Appl. No. 13/372,430, Advisory Action, Aug. 6, 2014.
U.S. Appl. No. 14/011,395, Office Action, Oct. 31, 2014.
"ECC and Signal Processing Technology for Solid State Drives and Multi-bit per cell NAND Flash Memories", Forward Insights, 2012, pp. 21, 2nd edition Report No. FI-NFL-FSP-0112.
U.S. Appl. No. 14/011,395, Notice of Allowance, Aug. 19, 2015.
Application No. 10816108.4, Office Action, Sep. 30, 2015.

\* cited by examiner

APPARATUS, SYSTEM, AND METHOD FOR POWER REDUCTION MANAGEMENT IN A STORAGE DEVICE

CROSS-REFERENCES TO RELATED APPLICATIONS

This application claims priority to and is a continuation of U.S. patent application Ser. No. 12/878,981 entitled "APPARATUS, SYSTEM, AND METHOD FOR POWER REDUCTION MANAGEMENT IN A STORAGE DEVICE" and filed on Sep. 9, 2010 for Lance L. Smith, et al. which claims priority to U.S. Provisional Patent Application No. 61/240,991 entitled "APPARATUS, SYSTEM, AND METHOD FOR POWER REDUCTION IN A SOLID-STATE STORAGE DEVICE" and filed on Sep. 9, 2009 for Lance L. Smith, et al., to U.S. Provisional Patent Application No. 61/245,622 entitled "APPARATUS, SYSTEM, AND METHOD FOR POWER REDUCTION IN A SOLID-STATE STORAGE DEVICE" and filed on Sep. 24, 2009 for Lance L. Smith, et al., and to U.S. Provisional Patent Application No. 61/368,564 entitled "APPARATUS, SYSTEM, AND METHOD FOR WRITING DATA TO STORAGE MEDIA IN A SINGLE ATOMIC OPERATION" and filed on Jul. 28, 2010 for David Flynn, et al., each of which are incorporated herein by reference.

TECHNICAL FIELD

This invention relates to efficient power usage during power disruptions and more particularly relates to preventing data loss in a storage device during power failure or power reduction.

BACKGROUND

Power usage matters a great deal in computing devices, in a number of different contexts. In one context, power matters in the event that the external power supply is lost. For example, solid-state storage devices (SSD) such as Flash memory are nonvolatile storage. Thus, devices writing to a SSD assume that data, once written, is permanently stored. However, in certain SSD devices, after receiving data, the SSD holds the data in volatile memory (such as DRAM, SRAM, registers, buffers, or the like) in order to perform a number of operations on the data. In the event of a power failure, data that is held in volatile memory may not be preserved.

SUMMARY

A method is presented for power reduction management. In one embodiment, the method includes determining that a power source has failed to supply electric power above a predefined threshold. In a further embodiment, the method includes terminating one or more non-essential in-process operations on a nonvolatile memory device during a power hold-up time. The method, in another embodiment, includes executing one or more essential in-process operations on the nonvolatile memory device within the power hold-up time.

An apparatus is presented for power reduction management. In one embodiment, a monitor module is configured to determine that a power source has failed to supply electric power above a predefined threshold to a nonvolatile storage device. An identification module, in a further embodiment, is configured to determine a prioritization of in-process operations for the nonvolatile storage device. In another embodiment, a termination module is configured to terminate one or more in-process operations based on the prioritization of in-process operations such that one or more essential in-process operations execute within a power hold-up time for the nonvolatile storage device.

A system for power reduction management is presented. A nonvolatile data storage device, in one embodiment, comprises a plurality of nonvolatile memory components. In a further embodiment, a monitor module is configured to determine that a primary power source has failed to supply electric power above a predefined threshold to the nonvolatile data storage device. In another embodiment, a termination module is configured to reset one or more of the plurality of nonvolatile memory components executing non-essential in-process operations so that one or more essential in-process operations execute on the one or more nonvolatile memory components within a power hold-up time.

A computer program product comprising a computer readable storage medium storing computer usable program code executable to perform operations for power reduction management is presented. The operations, in one embodiment, include initiating a power loss mode in a nonvolatile memory device in response to a power source failing to supply electric power above a predefined threshold. In another embodiment, the operations include interrupting one or more in-process erase operations executing on one or more nonvolatile memory components of the nonvolatile memory device during the power loss mode. In a further embodiment, the operations include executing one or more pending write operations on the one or more nonvolatile memory components in response to interrupting the one or more in-process erase operations such that the one or more pending write operations complete within a power hold-up time.

Another apparatus for power reduction management is presented. The apparatus, in one embodiment, includes means for determining that a primary power source has failed to supply electric power above a predefined threshold to a nonvolatile data storage device. In another embodiment, the apparatus includes means for providing secondary electric power for the nonvolatile data storage device for at least a power hold up time. The apparatus, in a further embodiment, includes means for adjusting execution of operations on the nonvolatile data storage device such that one or more essential operations execute on the nonvolatile data storage device within the power hold up time.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
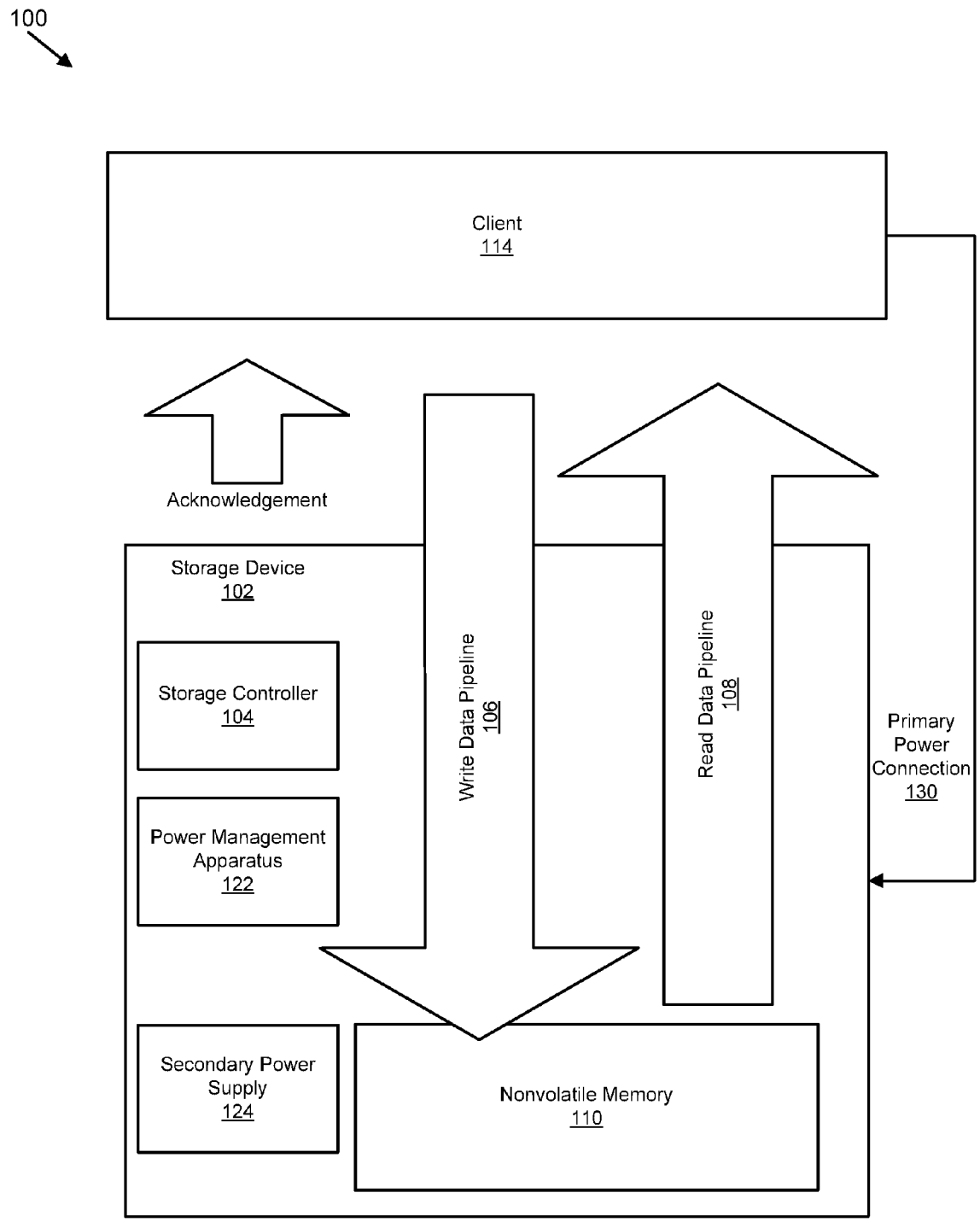
FIG. 1 is a schematic block diagram illustrating one embodiment of a system including a storage device with a power management apparatus enabling improved data handling in the event of an unexpected power failure.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages of the present invention will become more fully apparent from the following description and appended claims, or may be learned by the practice of the invention as set forth hereinafter.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

Power Reduction Management

FIG. 1 depicts one embodiment of a system 100 for improved data management in the event of a power failure, power reduction, or other power loss. In the depicted embodiment, the system 100 includes a client 114 and a storage device 102. The client 114 may be a computer such as a server, laptop, desktop, or other client device known in the art. The client 114 typically includes components such as memory, processors, buses, and other components as known to those of skill in the art.

The client 114 stores data in the storage device 102 and communicates data with the storage device 102 via a communications connection (not shown). The storage device 102 may be internal to the client 114 or external to the client 114. The communications connection may be a bus, a network, or other manner of connection allowing the transfer of data between the client 114 and the storage device 102. In one embodiment, the storage device 102 is connected to the client 114 by a PCI connection such as PCI express ("PCI-e"). The storage device 102 may be a card that plugs into a PCI-e connection on the client 114.

The storage device 102 also has a primary power connection 130 that connects the storage device 102 with a primary power source that provides the storage device 102 with the power that it needs to perform data storage operations such as reads, writes, erases, etc. The storage device 102, under normal operating conditions, receives the necessary power from the primary power source over the primary power connection 130. In certain embodiments, such as the embodiment shown in FIG. 1, the primary power connection 130 connects the storage device 102 to the client 114, and the client 114 acts as the primary power source that supplies the storage device 102 with power. In certain embodiments, the primary power connection 130 and the communications connection discussed above are part of the same physical connection between the client 114 and the storage device 102. For example, the storage device 102 may receive power over a PCI connection.

In other embodiments, the storage device 102 may connect to an external power supply via the primary power connection 130. For example, the primary power connection 130 may connect the storage device 102 with a primary power source that is a power converter (often called a power brick). Those in the art will appreciate that there are various ways by which a storage device 102 may receive power, and the variety of devices that can act as the primary power source for the storage device 102.

The storage device 102 provides nonvolatile storage for the client 114. FIG. 1 shows the storage device 102 comprising a write data pipeline 106, a read data pipeline 108, nonvolatile memory 110, a storage controller 104, a power management apparatus 122, and a secondary power supply 124. The storage device 102 may contain additional components that are not shown in order to provide a simpler view of the storage device 102.

The nonvolatile memory 110 stores data such that the data is retained even when the storage device 102 is not powered. Examples of nonvolatile memory 110 include solid state memory (such as Flash), hard disk, tape, or others. The storage device 102 also includes a storage controller 104 that coordinates the storage and retrieval of data in the nonvolatile memory 110. The storage controller 104 may use one or more indexes to locate and retrieve data, and perform other operations on data stored in the storage device 102. For example, the storage controller 104 may include a groomer for performing data grooming operations such as garbage collection.

As shown, the storage device 102, in certain embodiments, implements a write data pipeline 106 and a read data pipeline 108, an example of which is described in greater detail below with regard to FIG. 3. The write data pipeline 106 may perform certain operations on data as the data is transferred from the client 114 into the nonvolatile memory 110. These operations may include, for example, error correction code (ECC) generation, encryption, compression, and others. The read data pipeline 108 may perform similar and potentially inverse operations on data that is being read out of nonvolatile memory 110 and sent to the client 114.

The storage device 102 also includes a secondary power supply 124 that provides power in the event of a complete or partial power disruption resulting in the storage device 102 not receiving enough electrical power over the primary power connection 130. A power disruption is any event that unexpectedly causes the storage device 102 to stop receiving power over the primary power connection 130, or causes a significant reduction in the power received by the storage device 102 over the primary power connection 130. A significant reduction in power, in one embodiment, includes the power falling below a predefined threshold. The predefined threshold, in a further embodiment, is selected to allow for normal fluctuations in the level of power from the primary power connection 130. For example, the power to a building where the client 114 and the storage device 102 may go out. A user action (such as improperly shutting down the client 114 providing power to the storage device 102), a failure in the primary power connection 130, or a failure in the primary power supply may cause the storage device 102 to stop receiving power. Numerous, varied power disruptions may cause unexpected power loss for the storage device 102.

The secondary power supply 124 may include one or more batteries, one or more capacitors, a bank of capacitors, a separate connection to a power supply, or the like. In one embodiment, the secondary power supply 124 provides power to the storage device 102 for at least a power hold-up time during a power disruption or other reduction in power from the primary power connection 130. The secondary power supply 124, in a further embodiment, provides a power hold-up time long enough to enable the storage device 102 to flush data that is not in nonvolatile memory 110 into the nonvolatile memory 110. As a result, the storage device 102 can preserve the data that is not permanently stored in the storage device 102 before the lack of power causes the storage device 102 to stop functioning. In certain implementations, the secondary power supply 124 may comprise the smallest capacitors possible that are capable of providing a predefined power hold-up time to preserve space, reduce cost, and simplify the storage device 102. In one embodiment, one or more banks of capacitors are used to implement the secondary power supply 124 as capacitors are generally more reliable, require less maintenance, and have a longer life than other options for providing secondary power.

In one embodiment, the secondary power supply 124 is part of an electrical circuit that automatically provides power to the storage device 102 upon a partial or complete loss of power from the primary power connection 130. Similarly, the system 100 may be configured to automatically accept or receive electric power from the secondary power supply 124 during a partial or complete power loss. For example, in one embodiment, the secondary power supply 124 may be electrically coupled to the storage device 102 in parallel with the primary power connection 130, so that the primary power connection 130 charges the secondary power supply 124 during normal operation and the secondary power supply 124 automatically provides power to the storage device 102 in response to a power loss. In one embodiment, the system 100 further includes a diode or other reverse current protection between the secondary power supply 124 and the primary power connection 130, to prevent current from the secondary power supply 124 from reaching the primary power connection 130. In another embodiment, the power management apparatus 122 may enable or connect the secondary power supply 124 to the storage device 102 using a switch or the like in response to reduced power from the primary power connection 130.

An example of data that is not yet in the nonvolatile memory 110 may include data that may be held in volatile memory as the data moves through the write data pipeline 106. If data in the write data pipeline 106 is lost during a power outage (i.e., not written to nonvolatile memory 110 or otherwise permanently stored), corruption and data loss may result.

In certain embodiments, the storage device 102 sends an acknowledgement to the client 114 at some point after the storage device 102 receives data to be stored in the nonvolatile memory 110. The write data pipeline 106, or a sub-component thereof, may generate the acknowledgement. It is advantageous for the storage device 102 to send the acknowledgement as soon as possible after receiving the data.

In certain embodiments, the write data pipeline 106 sends the acknowledgement before data is actually stored in the nonvolatile memory 110. For example, the write data pipeline 106 may send the acknowledgement while the data is still in transit through the write data pipeline 106 to the nonvolatile memory 110. In such embodiments, it is highly desirable that the storage device 102 flush all data for which the storage controller 104 has sent an acknowledgement to the nonvolatile memory 110 before the secondary power supply 124 loses sufficient power in order to prevent data corruption and maintain the integrity of the acknowledgement sent.

In addition, in certain embodiments, some data within the write data pipeline 106 may be corrupted as a result of the power disruption. A power disruption may include a power failure as well as unexpected changes in power levels supplied. The unexpected changes in power levels may place data that is in the storage device 102, but not yet in nonvolatile memory 110, at risk. Data corruption may begin to occur before the power management apparatus 122 is even aware (or notified) that there has been a disruption in power.

For example, the PCI-e specification indicates that, in the event that a power disruption is signaled, data should be assumed corrupted and not stored in certain circumstances. Similar potential corruption may occur for storage devices 102 connected to clients 114 using other connection types, such as PCI, serial advanced technology attachment ("serial ATA" or "SATA"), parallel ATA ("PATA"), small computer system interface ("SCSI"), IEE 1394 ("FireWire"), Fiber Channel, universal serial bus ("USB"), PCIe-AS, or the like. A complication may arise when a power disruption occurs (meaning that data received from that point to the present time may be presumed corrupt), a period of time passes, the disruption is sensed and signaled, and the power management apparatus 122 receives the signal and becomes aware of the power disruption. The lag between the power disruption occurring and the power management apparatus 122 discovering the power disruption can allow corrupt data to enter the write data pipeline 106. In certain embodiments, this corrupt data should be identified and not stored to the nonvolatile memory 110. Alternately, this corrupt data can be stored in the nonvolatile memory 110 and marked as corrupt as described below. For simplicity of description, identifying corrupt data and not storing the data to the nonvolatile memory 110 will be primarily used to describe the functions and features herein. Furthermore, the client 114 should be aware that this data was not stored, or alternatively data for which integrity is a question is not acknowledged until data integrity can be verified. As a result, corrupt data should not be acknowledged.

The storage device 102 also includes a power management apparatus 122. In certain embodiments, the power management apparatus 122 is implemented as part of the storage controller 104. The power management apparatus 122 may be, for instance, a software driver or be implemented in firmware for the storage device 102. In other embodiments, the power management apparatus 122 may be implemented partially in a software driver and partially in the storage controller 104, or the like. In one embodiment, at least a portion of the power management apparatus 122 is implemented on the storage device 102, as part of the storage controller 104, or the like, so that the power management apparatus 122 continues to function during a partial or complete power loss using power from the secondary power supply 124, even if the client 114 is no longer functioning.

In one embodiment, the power management apparatus 122 initiates a power loss mode in the storage device 102 in response to a reduction in power from the primary power connection 130. During the power loss mode, the power management apparatus 122, in one embodiment flushes data that is in the storage device 102 that is not yet stored in nonvolatile memory 110 into the nonvolatile memory 110. In particular embodiments, the power management apparatus 122 flushes the data that has been acknowledged and is in the storage device 102 that is not yet stored in nonvolatile memory 110 into the nonvolatile memory 110. In certain embodiments, described below, the power management apparatus 122 may adjust execution of data operations on the storage device 102 to ensure that essential operations complete before the secondary power supply 124 loses sufficient power to complete the essential operations, i.e. during the power hold-up time that the secondary power supply 124 provides.

In certain embodiments, the essential operations comprise those operations for data that has been acknowledged as having been stored, such as acknowledged write operations. In other embodiments, the essential operations comprise those operations for data that has been acknowledged as having been stored and erased. In other embodiments, the essential operations comprise those operations for data that have been acknowledged as having been stored, read, and erased. The power management apparatus 122 may also terminate non-essential operations to ensure that those non-essential operations do not consume power unnecessarily and/or do not block essential operations from executing; for example, the power management apparatus 122 may terminate erase operations, read operations, unacknowledged write operations, and the like.

In one embodiment, terminating non-essential operations preserves power from the secondary power supply 124, allowing the secondary power supply 124 to provide the power hold-up time. In a further embodiment, the power management apparatus 122 quiesces or otherwise shuts down operation of one or more subcomponents of the storage device 102 during the power loss mode to conserve power from the secondary power supply 124. For example, in various embodiments, the power management apparatus 122 may quiesce operation of the read data pipeline 108, a read direct memory access ("DMA") engine, and/or other subcomponents of the storage device 102 that are associated with non-essential operations.

The power management apparatus 122 may also be responsible for determining what data was corrupted by the power disruption, preventing the corrupt data from being stored in nonvolatile memory 110, and ensuring that the client 114 is aware that the corrupted data was never actually stored on the storage device 102. This prevents corruption of data in the storage device 102 resulting from the power disruption.

In one embodiment, the system 100 includes a plurality of storage devices 102. The power management apparatus 122, in one embodiment, manages power loss modes for each storage device 102 in the plurality of storage devices 102, providing a system-wide power loss mode for the plurality of storage devices 102. In a further embodiment, each storage device 102 in the plurality of storage devices 102 includes a separate power management apparatus 122 that manages a separate power loss mode for each individual storage device 102. The power management apparatus 122, in one embodiment, may quiesce or otherwise shut down one or more storage devices 102 of the plurality of storage devices 102 to conserve power from the secondary power supply 124 for executing essential operations on one or more other storage devices 102.

In one embodiment, the system 100 includes one or more adapters for providing electrical connections between the client 114 and the plurality of storage devices 102. An adapter, in various embodiments, may include a slot or port that receives a single storage device 102, an expansion card or daughter card that receives two or more storage devices 102, or the like. For example, in one embodiment, the plurality of storage devices 102 may each be coupled to separate ports or slots of the client 114. In another example embodiment, one or more adapters, such as daughter cards or the like, may be electrically coupled to the client 114 (i.e. connected to one or more slots or ports of the client 114) and the one or more adapters may each provide connections for two or more storage devices 102.

In one embodiment, the system 100 includes a circuit board, such as a motherboard or the like, that receives two or more adapters, such as daughter cards or the like, and each adapter receives two or more storage devices 102. In a further embodiment, the adapters are coupled to the circuit board using PCI-e slots of the circuit board and the storage devices 102 are coupled to the adapters using PCI-e slots of the adapters. In another embodiment, the storage devices 102 each comprise a dual in-line memory module ("DIMM") of non-volatile solid-state storage, such as Flash memory, or the like. In one embodiment, the circuit board, the adapters, and the storage devices 102 may be external to the client 114, and may include a separate primary power connection 130. For example, the circuit board, the adapters, and the storage devices 102 may be housed in an external enclosure with a power supply unit ("PSU") and may be in communication with the client 114 using an external bus such as eSATA, eSATAp, SCSI, FireWire, Fiber Channel, USB, PCIe-AS, or the like. In another embodiment, the circuit board may be a motherboard of the client 114, and the adapters and the storage devices 102 may be internal storage of the client 114.

In view of this disclosure, one of skill in the art will recognize many configurations of adapters and storage devices 102 for use in the system 100. For example, each adapter may receive two storage devices 102, four storage devices 102, or any number of storage devices. Similarly, the system 100 may include one adapter, two adapters, three adapters, four adapters, or any supported number of adapters. In one example embodiment, the system 100 includes two adapters and each adapter receives four storage devices 102, for a total of eight storage devices 102.

In one embodiment, the secondary power supply 124 provides electric power to each of a plurality of storage devices 102. For example, the secondary power supply 124 may be disposed in a circuit on a main circuit board or motherboard and may provide power to several adapters. In a further embodiment, the system 100 includes a plurality of secondary power supplies that each provide electric power to a subset of a plurality of storage devices 102. For example, in one embodiment, each adapter may include a secondary power supply 124 for storage devices 102 of the adapter. In a further embodiment, each storage device 102 may include a secondary power supply 124 for the storage device 102. In view of this disclosure, one of skill in the art will recognize different arrangements of secondary power supplies 124 for providing power to a plurality of storage devices 102.

Solid-State Storage Device

Figure 2:
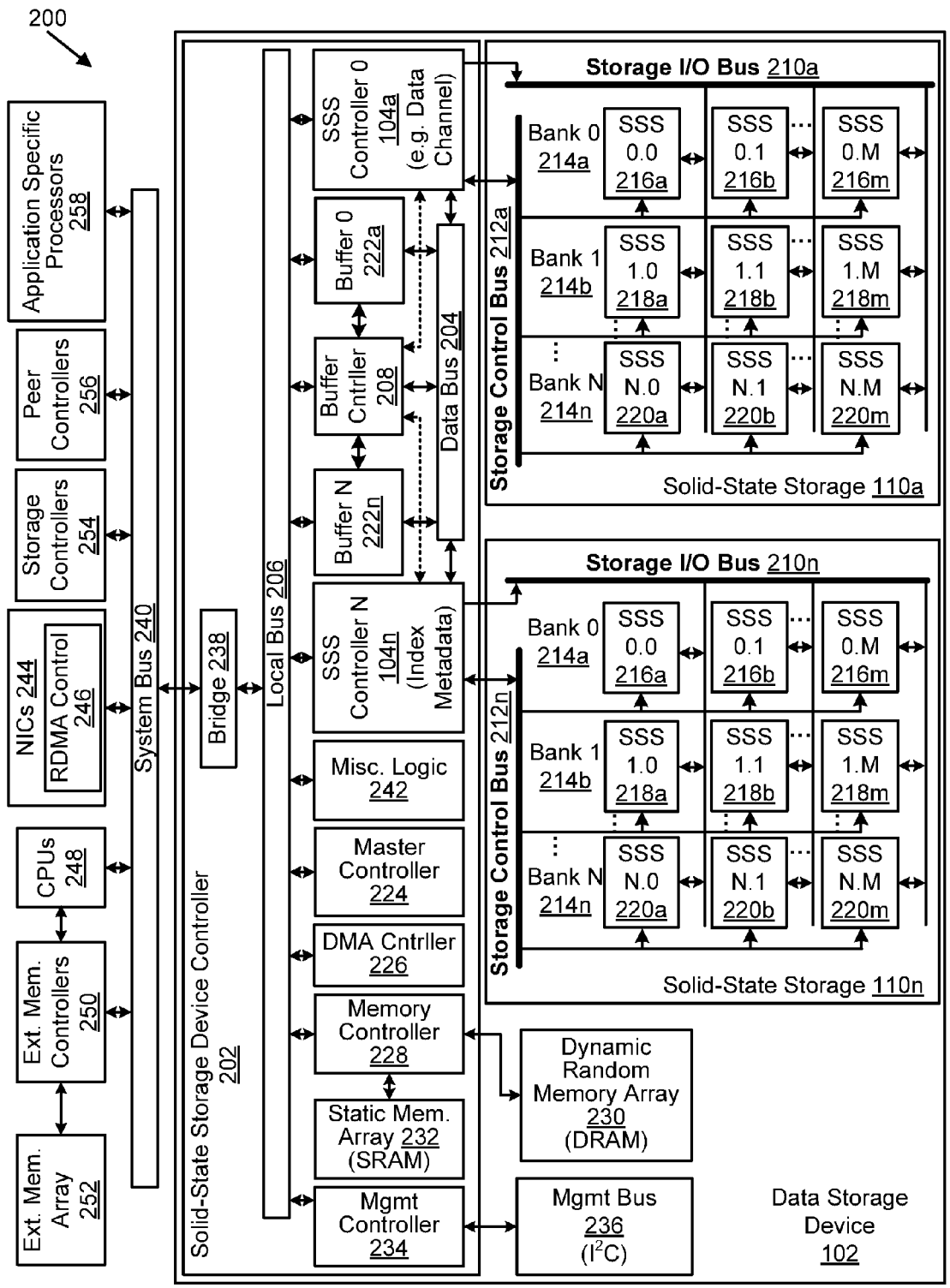
FIG. 2 is a schematic block diagram illustrating one embodiment of a solid-state storage device controller for a data storage device.

FIG. 2 is a schematic block diagram illustrating one embodiment 200 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage 110. In the depicted embodiment, two solid-state controllers are shown: solid-state controller 0 104a and solid-state storage controller N 104n, and each controls solid-state storage 110a-n. In the depicted embodiment, solid-state storage controller 0 104a controls a data channel so that the attached solid-state storage 110a stores data. Solid-state storage controller N 104n controls an index metadata channel associated with the stored data and the associated solid-state storage 110n stores index metadata. In an alternate embodiment, the solid-state storage device controller 202 includes a single solid-state controller 104a with a single solid-state storage 110a. In another embodiment, there are a plurality of solid-state storage controllers 104a-n and associated solid-state storage 110a-n. In one embodiment, one or more solid state controllers 104a-104n-1, coupled to their associated solid-state storage 110a-110n-1, control data while at least one solid-state storage controller 104n, coupled to its associated solid-state storage 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid state storage 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage 110, data cannot be read from the solid-state storage 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a row of solid-state storage elements 216a, 216b, 216m is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage 110. Of course different embodiments may include different values for n and m. In one embodiment, a solid-state storage 110a includes twenty solid-state storage elements 216, 218, 220 per bank 214 with eight banks 214. In one embodiment, the solid-state storage media 110a includes twenty four solid-state storage elements 216, 218, 220 per bank 214 with eight banks 214. In addition to the n×m storage elements 216, 218, 220, one or more additional columns (P) may also be addressed and operated in parallel with other solid-state storage elements 216a, 216b, 216m for one or more rows. The added P columns in one embodiment, store parity data for the portions of an ECC chunk (i.e. an ECC codeword) that span m storage elements for a particular bank. In one embodiment, each solid-state storage element 216, 218, 220 is comprised of single-level cell ("SLC") devices. In another embodiment, each solid-state storage element 216, 218, 220 is comprised of multi-level cell ("MLC") devices.

In one embodiment, solid-state storage elements that share a common storage I/O bus 210a (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 8.0) 216a-220a, each in a separate bank 214a-n. In another embodiment, 24 storage elements (e.g. SSS 0.0-SSS 0.24) 216 form a logical bank 214a so that each of the eight logical banks has 24 storage elements (e.g. SSS 0.0-SSS 8.24) 216, 218, 220. Data is sent to the solid-state storage 110 over the storage I/O bus 210 to all storage elements of a particular group of storage elements (SSS 0.0-SSS 8.0) 216a, 218a, 220a. The storage control bus 212a is used to select a particular bank (e.g. Bank 0 214a) so that the data received over the storage I/O bus 210 connected to all banks 214 is written just to the selected bank 214a.

In a one embodiment, the storage I/O bus 210 is comprised of one or more independent I/O buses ("IIOBa-m" comprising 210a.a-m, 210n.a-m) wherein the solid-state storage elements within each column share one of the independent I/O buses that accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216a, 216b, 216m is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2000 bytes ("2 kB"). In one example, a solid-state storage element (e.g. SSS 0.0) includes two registers and can program two pages so that a two-register solid-state storage element 216, 218, 220 has a capacity of 4 kB. A bank 214 of 20 solid-state storage elements 216a, 216b, 216m would then have an 80 kB capacity of pages accessed with the same address going out the channels of the storage I/O bus 210.

This group of pages in a bank 214 of solid-state storage elements 216a, 216b, 216m of 80 kB may be called a logical page or virtual page. Similarly, an erase block of each storage element 216a-m of a bank 214a may be grouped to form a logical erase block or a virtual erase block. In one embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a particular physical erase block of a particular storage element of a particular bank, a physical address is sent on the storage I/O bus 210 and followed by the packet. The physical address contains enough information for the solid-state storage element 216, 218, 220 to direct the packet to the designated location within the page. Since all storage elements in a column of storage elements (e.g. SSS 0.0-SSS N.0 216a, 218a, 220a) are accessed simultaneously by the appropriate bus within the storage I/O bus 210a.a, to reach the proper page and to avoid writing the data packet to similarly addressed pages in the column of storage elements (SSS 0.0-SSS N.0 216a, 218a, 220a), the bank 214a that includes the solid-state storage element SSS 0.0 216a with the correct page where the data packet is to be written is simultaneously selected by the storage control bus 212.

Similarly, satisfying a read command on the storage I/O bus 210 requires a simultaneous signal on the storage control bus 212 to select a single bank 214a and the appropriate page within that bank 214a. In one embodiment, a read command reads an entire page, and because there are multiple solid-state storage elements 216a, 216b, 216m in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. Bank 0 214a) is selected over the storage control bus 212 to prevent erasure of similarly addressed erase blocks in all of the banks (Banks 1-N 214b-n). Alternatively, no particular bank (e.g. Bank 0 214a) is selected over the storage control bus 212 to enable erasure of similarly addressed erase blocks in all of the banks (Banks 1-N 214b-n) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage 110. For example, packets are streamed to the storage write buffers of a bank 214a of storage elements 216 and when the buffers are full, the packets are programmed to a designated logical page. Packets then refill the storage write buffers and, when full, the packets are written to the next logical page. The next logical page may be in the same bank 214a or another bank (e.g. 214b). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the solid-state storage 110. When a copy is made, a new copy of the requested data is created and a new entry is created in the index mapping the new copy of the requested data to the original packets. The new copy of the requested data is also written to the solid-state storage 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the solid-state storage 110 and allows the solid-storage device controller 202 to monitor storage hot spots and level usage of the various logical pages in the solid-state storage 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the client 114 or may be other devices.

Typically the solid-state storage controller(s) 104 communicate data to the solid-state storage 110 over a storage I/O bus 210. In a typical embodiment where the solid-state storage is arranged in banks 214 and each bank 214 includes multiple storage elements 216a, 216b, 216m accessed in parallel, the storage I/O bus 210 is an array of busses, one for each column of storage elements 216, 218, 220 spanning the banks 214. As used herein, the term "storage I/O bus" may refer to one storage I/O bus 210 or an array of data independent busses 204. In one embodiment, each storage I/O bus 210 accessing a column of storage elements (e.g. 216a, 218a, 220a) may include a logical-to-physical mapping for storage divisions (e.g. erase blocks) accessed in a column of storage elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage 110a-110n-1 while at least one channel (solid-state storage controller 104n, solid-state storage 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a client 114 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/solid-state storage device controller 202 manages multiple data storage devices/solid-state storage 110a-n, the master controller 224 divides the work load among internal controllers, such as the solid-state storage controllers 104a-n. For example, the master controller 224 may divide an object to be written to the data storage devices (e.g. solid-state storage 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a client 114 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in a computer such as the client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple logical devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
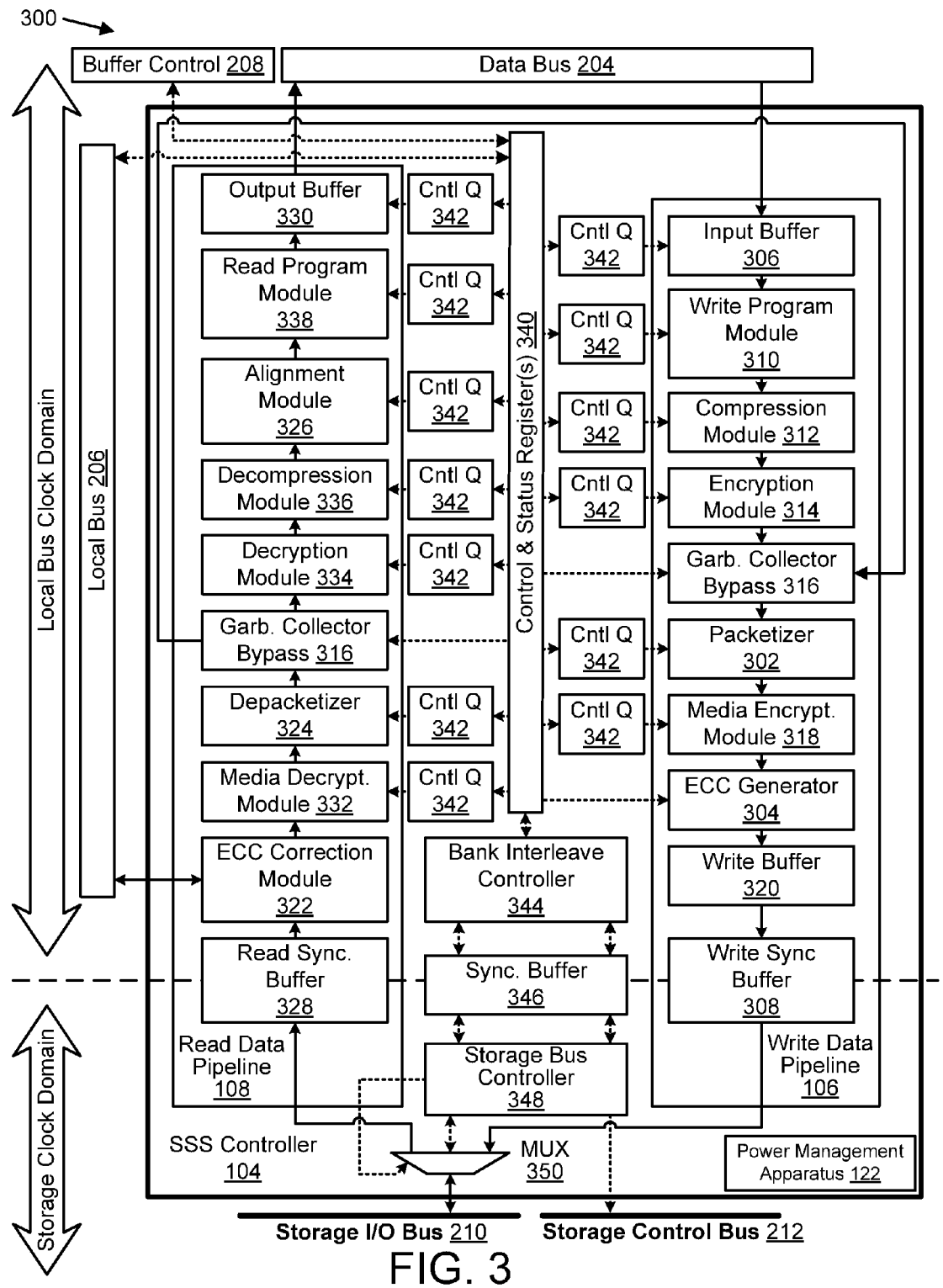
FIG. 3 is a schematic block diagram illustrating one embodiment of a solid-state storage controller with a write data pipeline and a read data pipeline in a data storage device.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the client 114, or other computer or device and is transmitted to the solid-state storage device 102 in data segments streamed to the solid-state storage device 102. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicates the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the ECC algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the client 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synchronization buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, solid-state storage device 102, or server, the contents of the solid-state storage media 110 typically could not be read without use of the same encryption key used during the write of the data to the solid-state storage media 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a client 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The solid-sate storage device 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a client 114, another computer, key manager, or other device that holds the encryption key to be used to encrypt the data segment. In one embodiment, encryption keys are transferred to the solid-state storage controller 104 from one of a solid-state storage device 102, client 114, computer, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102, if the solid-state storage media 110 is connected to a different solid-state storage controller 104, solid-state storage device 102, or client 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by clients 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a client 114, a computer, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
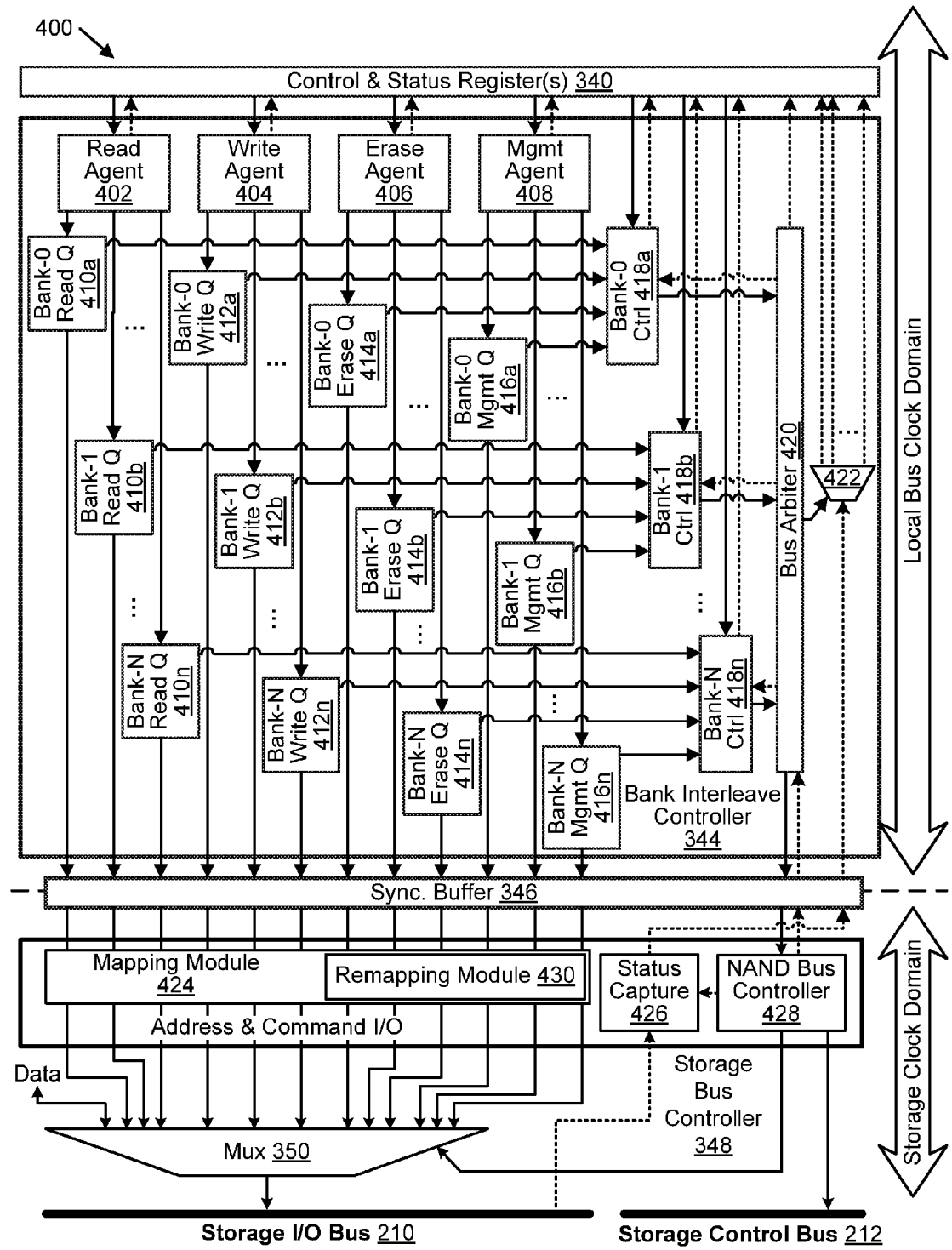
FIG. 4 is a schematic block diagram illustrating one embodiment of a bank interleave controller in a solid-state storage controller.

The solid-state storage controller 104 and or solid-state storage device 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write subcommand on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write synchronization buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While Bank 0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216a-m, 218a-m, 220a-m. For example, one bank interleave controller 344 serves one column of storage elements SSS 0.0-SSS N.0 216a, 218a, . . . 220a, a second bank interleave controller 344 serves a second column of storage elements SSS 0.1-SSS N.1 216b, 218b, . . . 220b etc.

Storage-Specific Components

The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each column of solid-state storage elements (e.g. SSS 0.0 216a, SSS 1.0 218a, SSS N.0 220a). A MUX 350 combines data from the write data pipeline 106 and commands sent to the solid-state storage media 110 via the storage I/O bus 210 and separates data to be processed by the read data pipeline 108 from commands. Packets stored in the write buffer 320 are directed on busses out of the write buffer 320 through a write synchronization buffer 308 for each column of solid-state storage elements (SSS 0.x to SSS N.x 216, 218, 220) to the MUX 350 for each column of solid-state storage elements (SSS 0.x to SSS N.x 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage media 110 with an array of twenty storage elements (e.g. SSS 0.0 to SSS 0.M 216) per bank 214a may have a logical address for a particular erase block mapped to twenty physical addresses of the erase block, one physical address per storage element. Because the storage elements are accessed in parallel, erase blocks at the same position in each storage element in a column of storage elements 216a, 218a, 220a will share a physical address. To select one erase block (e.g. in storage element SSS 0.0 216a) instead of all erase blocks in the row (e.g. in storage elements SSS 0.0, 1.0, . . . N.0 216a, 218a, 220a), one bank (in this case Bank 0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 0.1 216b, ..., and to storage element 0.M 216m, virtual erase block 2 may be mapped to erase block 2 of storage element SSS 1.0 218a, to erase block 2 of storage element SSS 1.1 218b, ..., and to storage element 1.M 218m, etc. Alternatively, virtual erase block 1 may be mapped to one erase block from each storage element in an array such that virtual erase block 1 includes erase block 1 of storage element SSS 0.0 216a to erase block 1 of storage element SSS 0.1 216b to storage element 0.M 216m, and erase block 1 of storage element SSS 1.0 218a to erase block 1 of storage element SSS 1.1 218b, ..., and to storage element 1.M 218m, for each storage element in the array up to erase block 1 of storage element N.M 220m.

If erase block 1 of a storage element SSS 0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216a is available and currently not mapped, the remapping module 430 could change the mapping of virtual erase block 1 to point to erase block 221 of storage element SSS 0.0 216a, while continuing to point to erase block 1 of storage element SSS 0.1 216b, erase block 1 of storage element SSS 0.2 (not shown) . . . , and to storage element 0.M 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage media 110 and sends the status messages to the status MUX 422. In another embodiment, when the solid-state storage media 110 is flash memory, the storage bus controller 348 includes a NAND bus controller 428. The NAND bus controller 428 directs commands from the read and write data pipelines 106, 108 to the correct location in the solid-state storage media 110, coordinates timing of command execution based on characteristics of the flash memory, etc. If the solid-state storage media 110 is another solid-state storage type, the NAND bus controller 428 would be replaced by a bus controller specific to the storage type. One of skill in the art will recognize other functions of a NAND bus controller 428.

Power Failure Management

Figure 5A:
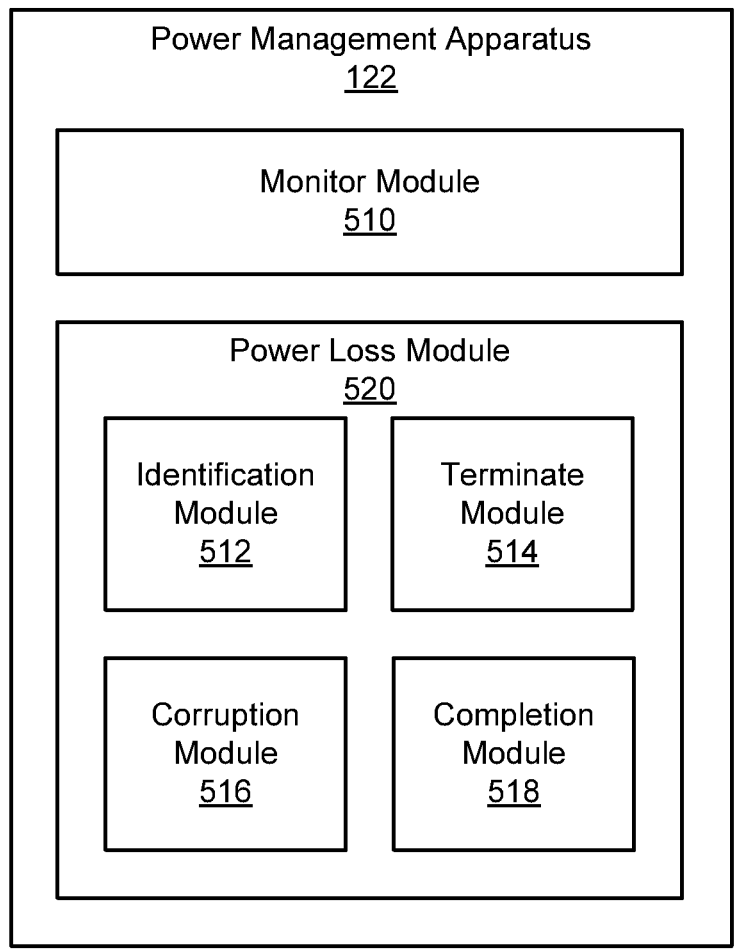
FIG. 5A is a schematic block diagram illustrating one embodiment of a power management apparatus.

FIG. 5A shows one embodiment of a power management apparatus 122. In one embodiment, the power management apparatus 122 may include a monitor module 510 and a power loss module 520. In a further embodiment, the power loss module 520 includes an identification module 512, a terminate module 514, a corruption module 516, and a completion module 518.

The monitor module 510, in one embodiment, initiates a power loss mode in the nonvolatile storage device 102 in response to a primary power source failing to supply electric power above a predefined threshold through the primary power connection 130. The power loss mode, in one embodiment, is a mode of operation in which the power management apparatus 122 prepares the storage device 102 for shutting down within a power hold-up time provided by the secondary power supply 124. The power loss module 520, in one embodiment, adjusts execution of in-process operations on the nonvolatile storage device 102 during the power loss mode, to allow essential in-process operations to execute.

In one embodiment, power above the predefined threshold is sufficient for the storage device 102. Sufficient power, in one embodiment, is power that meets the requirements for the storage device 102 to operate properly. The predefined threshold, in a further embodiment, is set at or above an insufficient power level for the storage device 102. Insufficient power is power that does not meet the requirements for the storage device 102. Power with a high AC or harmonic component when DC is expected and a voltage or current level that is too low are examples of insufficient power. As described above, in one embodiment, the storage device 102 is configured to automatically accept or otherwise draw power from the secondary power supply 124 when power from the primary power source falls below the predefined threshold. The predefined threshold, in one embodiment, is an engineered threshold determined by characteristics of the secondary power supply 124 and corresponding circuits.

The primary power source, in one embodiment, is a source of power that the nonvolatile storage device 102 uses during normal operation and which provides a substantially continuous supply of power that is not unexpectedly interrupted during normal operation. For example, in typical embodiments, the computer system (i.e. the client 114 or the like) to which the storage device 102 is attached is the primary power source and provides power through the motherboard, such as through a bus or slot connection such as PCI, PCIe, AGP, or the like, or through an external port such as a USB port, a FireWire port, an eSATAp port, or the like. In another embodiment, the primary power source is a standard electrical outlet.

In one embodiment, the monitor module 510 monitors the primary power connection 130 directly to determine when electric power from the primary power source falls below the predefined threshold. For example, the monitor module 510 may include a power sensor, a current sensor, and/or another appropriate sensor to use to determine whether the nonvolatile storage device 102 is receiving sufficient external power. In other embodiments, the monitor module 510 may be notified by another component in the nonvolatile storage device 102 in the event the nonvolatile storage device 102 loses external power.

In one embodiment, the monitor module 510 includes an analog circuit that responds to a loss of power from the primary power connection 130. For example, the primary power connection 130 and the secondary power supply 124 may be placed in parallel such that the primary power connection 130 keeps the secondary power supply 124 fully charged (for example, when the secondary power supply 124 is made up of capacitors) and also supplies power to the storage device 102. In the parallel configuration, the secondary power supply 124 naturally begins providing power in the event of a failure of the primary power connection 130, and the storage device 102 naturally accepts the power from the secondary power supply 124. The monitor module 510 circuit may also provide proper isolation to ensure that power from the secondary power supply 124 is sent to the storage device 102; for example, a diode may be used to ensure that, in the event of a failure in the primary power supply, power flows from the secondary power supply 124 to the storage device 102, and not to the failed primary power supply. Approaches to proper isolation will be appreciated by those of skill in the art in light of this disclosure.

The monitor module 510, in such an embodiment, may still include detection components (such as current sensors, voltage sensors, or the like) to sense the power disruption and to initiate the power loss mode to trigger the operations of other modules in the power management apparatus 122 in response. In another embodiment, monitor module 510 may sense a power disruption signal and activate a switch that changes the power draw for the storage device 102 from the primary power connection 130 to the secondary power supply 124, or the like.

The monitor module 510, in one embodiment, may initiate the power loss mode by directly or indirectly communicating to the power loss module 520 and/or another module that the storage device 102 has entered the power loss mode. For example, in various embodiments, the monitor module 122 may set a status register, send a power loss mode command, send a power loss signal, send a power loss interrupt, initiate a power loss mode function or procedure, place the storage device in a power loss state, and/or otherwise notify the power loss module 520 of the power loss mode.

The power loss module 520, in one embodiment, adjusts execution of in-process operations on the storage device 102 during the power loss mode, to ensure that essential operations, such as operations acknowledged to the client 114 or the like, are executed during the power hold-up time. In-process operations, in one embodiment, include operations that the storage device 102 is currently executing. In a further embodiment, in-process operations include operations that are queued for execution on the storage device 102, that are in-flight in the write data pipeline 106 and/or the read data pipeline 108, or the like. In the depicted embodiment, the power loss module 520 includes the identification module 512, the terminate module 514, and the corruption module 516.

The identification module 512, in one embodiment, identifies one or more non-essential operations on the nonvolatile storage device 102 in response to the monitor module 510 determining that external power has been lost, is below the predefined threshold, or is otherwise insufficient and entering the power loss mode. Non-essential operations are those operations that can be terminated, stopped, or paused, without causing data corruption or data loss on the storage device 102. Essential operations are those operations that must be executed in order to avoid data corruption, data loss on the storage device 102, or inconsistent communications between the storage device 102 and the client 114 (i.e. sending an acknowledgement to the client 114 for data that later is not properly handled consistent with the acknowledgement). The identification module 512 may further determine whether the non-essential operations are executing, or whether they are queued and awaiting execution.

The terminate module 514, in one embodiment, terminates the non-essential operations identified by the identification module 512. The terminate module 514, in various embodiments, may terminate non-essential operations by erasing the non-essential operations, commands, and instructions that are queued and/or by interrupting non-essential operations that are currently executing on the storage device 102. In one embodiment, the terminate module 514 allows the storage device 102 to power off (i.e. once the power hold-up time has expired and the secondary power supply 124 is depleted) without executing the non-essential operations. In a further embodiment, the terminate module 514 terminates the non-essential operations in a way that the non-essential operations are not executed or resumed once the storage device 102 is again powered on after a power loss. For example, in one embodiment, the terminate module 514 terminates the non-essential operations without leaving a record of the terminated non-essential operations, so that the storage device 102 powers on without executing or resuming the terminated non-essential operations.

In one embodiment, the identification module 512 also manages a power budget for the storage device 102 while the storage device 102 is operating on the secondary power supply 124. The identification module 512 may determine, for example, how much power is available, how much power all pending operations on the storage device 102 will require, and prioritize the pending operations. The operations may thus be reordered and executed in order of priority, to execute at least the essential in-process operations within the power hold-up time. In one embodiment, if the identification module 512 determines that there is insufficient power to execute all write operations (i.e. program operations on a nonvolatile solid-state storage device), possibly due to an error or failure, the identification module 512 may log this information to provide notification, possibly after power is restored, to a user or system that some or all of the write operations have been lost.

In one embodiment, the non-essential operations include erase operations that are erasing nonvolatile memory 110 on the nonvolatile storage device 102 and/or read operations that are reading data on the nonvolatile storage device 102. The erase operations may have been generated, for example, as part of a garbage collection operation that is reclaiming space on a solid state storage device such as a Flash memory device. Non-essential operations may also include operations such as generating a hash key for data in the nonvolatile storage device 102, decompressing data read from storage, or other operations. Non-essential operations, in a further embodiment, may include write (or program) operations for which the nonvolatile storage device 102 has not sent an acknowledgement to the client 114. In one embodiment, a user or system designer specifies which operations are essential and which operations are non-essential.

In certain embodiments, the terminate module 514 terminates the non-essential operations based on how much power they require. For example, erase operations in solid state storage devices tend to consume considerable amounts of power. The terminate module 514 may quickly terminate the erase operations in order to conserve power. In contrast, read operations require relatively little power. The terminate module 514 may begin terminating read operations only after the erase operations are terminated, or the like.

In one embodiment, the identification module 512 prioritizes operations, with the priorities based on the importance of executing the operation. For example, program operations for data that has been acknowledged may be given the highest priority, while an erase operation is given the lowest priority.

The terminate module 514 may begin terminating the lowest priority operations and move up a prioritized list of operations, and not terminate any essential operations. Thus, the terminate module 514, beginning with the lowest priority operation, determines if the operation is essential. If not, that operation is terminated. If the operation is essential, the operation is not terminated and the terminate module 514 moves to the next operation for consideration.

In certain embodiments, the identification module 512 may also prioritize non-essential operations that are in the process of executing based on the amount of energy required to complete the non-essential operation. For example, an erase operation that is 90% complete may be given a lower priority for termination than an erase operation that is 5% complete; thus, the erase operation that is 90% may be allowed to complete, while the erase operation that is 5% complete when the power disruption is detected is stopped. In one embodiment, the amount of energy required for an operation may vary over the time during which the operation is executed.

The terminate module 514, in one embodiment, terminates non-essential operations identified by the identification module 512. As noted above, the terminate module 514 may terminate certain classes of operations (such as power-intensive erase operations or autonomous grooming operations), as prioritized by the identification module 512, for termination before other operations. In one embodiment, the terminate module 514 terminates the non-essential operation by identifying the memory area or component on which the operation is working/executing and resetting the memory area or component, as discussed in greater detail in connection with FIG. 6. As used herein, a memory area or component refers to a physical section of the nonvolatile memory 110 for which operations executing on that physical section can be reset, terminated, halted, suspended, or paused with a command or signal.

By terminating the non-essential operations, the power management apparatus 122 can ensure that power is used for essential write operations and other essential operations so that the essential operations can execute within the power hold-up time. In addition, the power management apparatus 122 can thus reduce the total amount of power that the secondary power supply 124 needs to provide. Thus a designer is permitted to choose, for example, to use smaller capacitors to provide power, which may save space in the storage device 102, reduce cost, and improve reliability while maintaining the ability to ensure that all received and acknowledged data is preserved and protected from unexpected power disruptions.

In one embodiment, the terminate module 514 determines whether the particular non-essential operation is either queued or executing. The terminate module 514 may delete queued non-essential operations by removing them from the queue to ensure that they do not execute. Alternatively, or in addition, the terminate module 514 may cancel operations that are executing to prevent the executing operations from consuming additional power. In certain embodiments, as mentioned above, the terminate module 514 terminates some non-essential operations that are in process while allowing others to complete.

The corruption module 516, in one embodiment, identifies data received by the storage device 102 that is to be written to the nonvolatile memory 110 that is presumed to be corrupt, or must be presumed to be corrupt. Such data may, for example, be data in the write data pipeline 106. The corruption module 516 ensures that the data that is presumed to be corrupt is not stored to the nonvolatile memory 110 and also ensures that the client 114 is either made aware that the data was not stored, or ensures that the client 114 is not told that the corrupt data was successfully stored.

In certain embodiments, the corruption module 516 and the terminate module 514 log the actions taken once the monitor module 510 detects the power disruption. For example, the terminate module 514 may log which non-essential operations were canceled before they began execution and which non-essential operations were terminated during execution. The corruption module 516 may log information concerning what data it determined to be corrupt. Other modules in the power management apparatus 122 may similarly log their activity, or a subset thereof, to help the storage device 102, the client 114, or other interested entity determine what occurred during the unexpected shutdown.

In one embodiment, the corruption module 516 expects that all data received by the storage device 102 beginning at some specified time in the past (for example, 5 microseconds) before the power disruption signal was received by the monitor module 510 is corrupt and should not be stored in the nonvolatile storage 110. This specification may be dictated by a standard such as PCI, PCI-e, or the like or by the client 114, storage device 102, vendor, manufacturer, etc. In a further embodiment, the corruption module 516 regards data that is in-flight in the write data pipeline 106 before a predefined stage as corrupted.

Figure 5B:
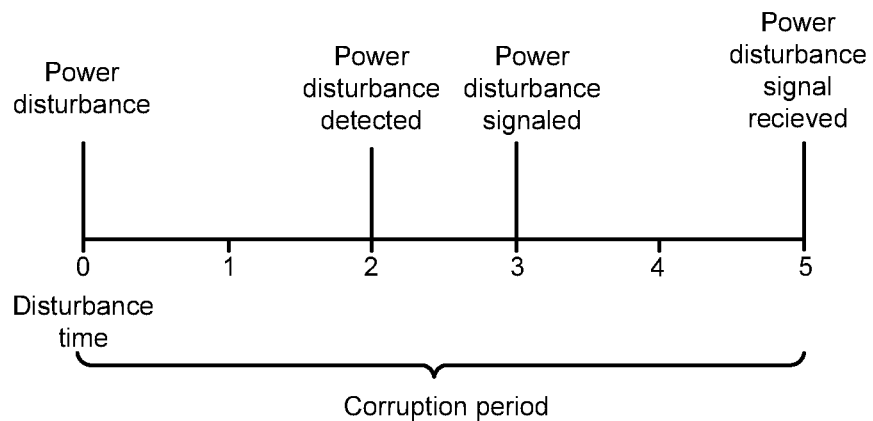
FIG. 5B is a one example of a timeline relevant to data corruption.

FIG. 5B shows one example of a timeline relevant to data corruption. At time 0, a power disturbance occurs. This point in time is referred to as the disturbance time. There is a resulting period of time that passes between the power disturbance occurring and when the power disturbance signal is received by the monitor module 510, when the monitor module 510 detects the power disturbance, or the like. This period of time is referred to herein as the corruption period. While the specification may provide example corruption periods (such as the 5 microseconds mentioned above), the corruption period is not limited to such, and may vary based on the standards and the assumptions of the developer, manufacturer, designer, and the like.

The corruption period is a result of the time necessary to detect the power disturbance (shown occurring at 5 microseconds), generate a signal indicating that there has been a power disturbance (shown occurring at 3 microseconds), and the monitor module 510 receiving the power disturbance signal (shown occurring at 5 microseconds). Generally, the corruption module 516 prevents new data from entering the write data pipeline 106 once it is determined that there has been a power disturbance as this new data is presumed corrupt. However, corrupt data may have moved into the write data pipeline 106 during the corruption period.

Thus, all data received after the corruption time is presumed to be corrupt and should not be stored. For example, the corruption module 516 may determine that the monitor module 510 received a power disruption signal at time t, and the corruption module 516 may always set the corruption time to t−5 microseconds. The corruption module 516 may therefore conclude that all data received after the corruption time of t−5 microseconds is corrupt. In such an embodiment, the corruption module 516 identifies all write operations (i.e. program operations for Flash memory and the like) received after t−5 microseconds, determines where they are in the write data pipeline 106, and skips the write operations. The corruption module 516, in various embodiments, may skip the write operations by canceling them, skipping them, clearing them, interrupting them, or otherwise failing to execute them.

In one embodiment, the power management apparatus 122 also includes a completion module 518. In some implementations, certain operations associated with stages in a write data pipeline 106 will not execute or permit continued flow of data through the pipeline until a buffer associated with that stage is filled. For example, an ECC stage, such as the ECC generator 304 of FIG. 3, may require a full buffer before generating the ECC value. Similarly, an output buffer, such as the write buffer 320, the write synchronization buffer 308, or the like may have to be filled before the data is moved out of the output buffer and onto the nonvolatile storage 110. In one embodiment, if a buffer is partially filled, under normal conditions, the stage associated with the buffer will wait until the buffer is filled before operations associated with that buffer are executed. The buffers referred to herein may be physical buffers, or may simply be temporary storage locations such as registers, DRAM locations, or others. In a further embodiment, the packetizer 302 may not pass a packet to a further stage in the write data pipeline 106 until the packet is complete, until a group of packets are complete, or the like. Similarly, the write buffer 320, in certain embodiments, may not send data to the storage device 102 until a page, a logical page, a group of pages or logical pages, or the like is complete.

In the event of a power disruption, it may be useful to move data through the write data pipeline 106 even if a buffer, packet, or page at one or more stages is not filled, to flush the data to the nonvolatile memory 110, or the like. The completion module 518 flushes data in a partially filled data buffer through the write data pipeline 106 and onto the nonvolatile memory 110. In one embodiment, the completion module 518 identifies the partially filled buffers, packets, and/or pages that will not fill and pads the buffers with pad data such that the data is moved out of the buffers and through the write data pipeline 106.

The completion module 518, in one embodiment, ensures that the padding is identifiable as pad data to ensure that the storage device 102 and/or the client 114 can identify the padding and know that the pad data is not part of the actual data. In one embodiment, the completion module 518 uses a unique header, token, marker, pattern, or other identifier to identify the padding data. In a further embodiment, the completion module 518 flushes a buffer, packet, and/or page without adding padding data, using existing data in the unfilled space in the buffer to complete the partially filled buffer, packet, and/or page. For example, a buffer, in an unfilled or empty state, may store all binary ones, all binary zeroes, junk or garbage data, data from a previous transaction, or the like. The completion module 518, in one embodiment, identifies the existing data in the unfilled area of the buffer as padding data. The completion module 518 may use a unique pattern, a flag or other indicator, or other approaches known to those in the art, in light of this disclosure.

The completion module 518, in one embodiment, uses a unique header, footer, token, marker, pattern, or other identifier to identify that the power management apparatus 122 has successfully completed the essential operations in the power loss mode. In one embodiment, successfully completing the essential operations means that the completion module 518 successfully flushed write data from write operations through the write data pipeline 106 and to the nonvolatile memory 110, or the like. The indicator, in one embodiment, is the same indicator described above to identify the padding data. In a further embodiment, the completion module 518 uses a separate indicator to identify successful execution of essential operations during the power loss mode.

Figure 6:
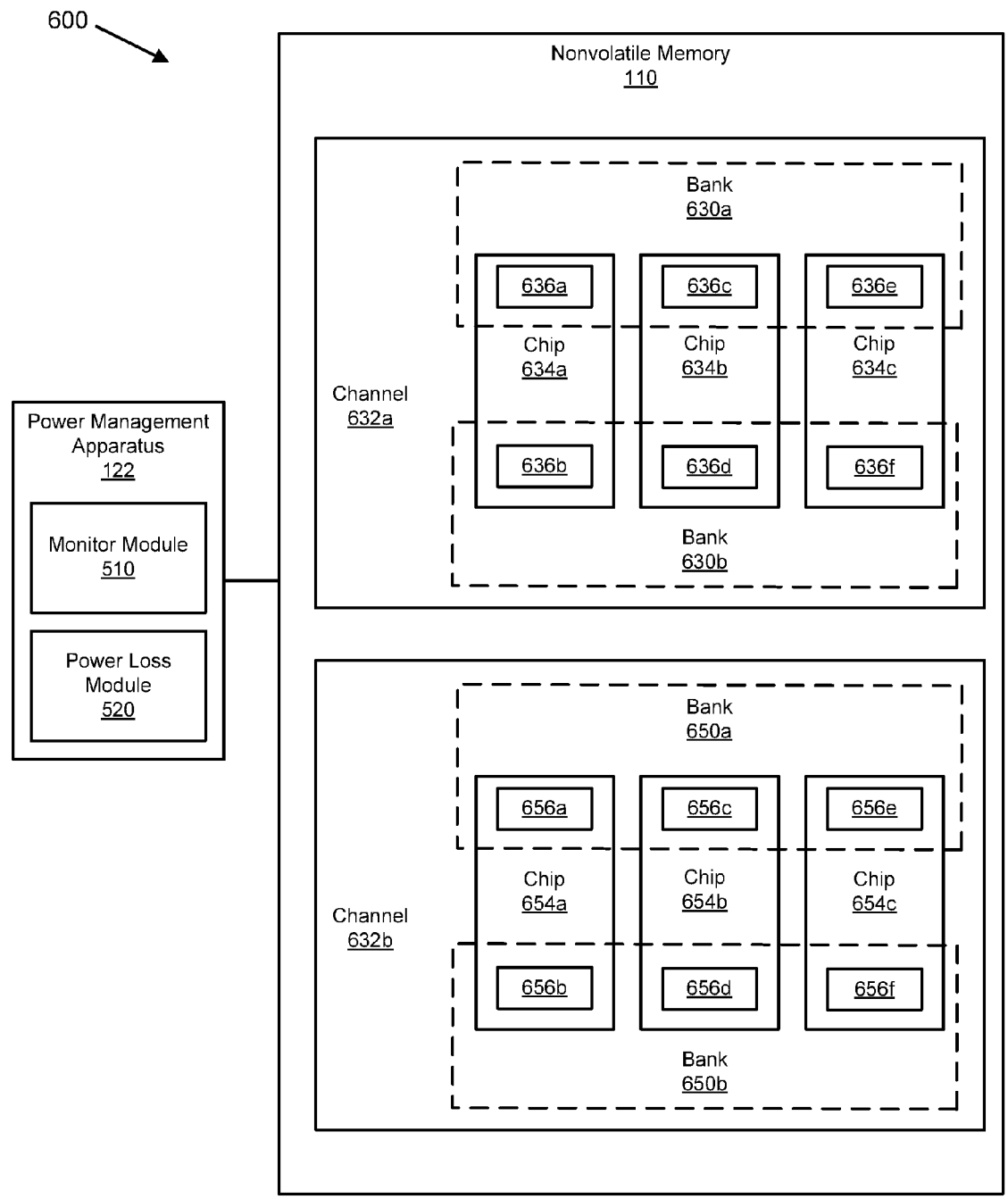
FIG. 6 is a schematic block diagram illustrating one embodiment of a power management apparatus and nonvolatile memory with which the power management apparatus interacts.

FIG. 6 shows one embodiment 600 of a power management apparatus 122 and a nonvolatile memory 110. As mentioned above, the power management apparatus 122 may be part of a storage controller 104. The power management apparatus 122 and the nonvolatile memory 110 may be physically part of the same storage device 102. The power management apparatus 122 may perform the operations described in connection with FIG. 5A. In the depicted embodiment, the power management apparatus 122 includes the monitor module 510 and the power loss module 520. The power loss module 520, in a further embodiment, may include the identification module 512, the terminate module 514, the corruption module 516, and/or the completion module 518. The power management apparatus 122 is also in communication with the nonvolatile memory 110 such that the power management apparatus 122 communicates signals to the nonvolatile memory 110, either directly or indirectly. The power management apparatus 122 may, for example, be able to send control signals to the nonvolatile memory 110.

FIG. 6 shows one embodiment of an architecture for the nonvolatile memory 110. The nonvolatile memory 110 may include channels 632a and 632b. The channels may include multiple banks; for example, the channel 632a includes banks 630a and 630b, and the channel 632b includes banks 650a and 650b. In certain embodiments, the chips 634a-c and 654a-c include multiple die 636a-f and 656a-f. In certain embodiments, one die on each chip 634a-c and 654a-c is used to form a bank. As shown, bank 630a encompasses dies 636a, 636c, and 636e. Bank 630b includes dies 636b, 636d, and 636f. Banks 650a and 650b are similarly made up of one die on the chips 654a-c. In one embodiment, the nonvolatile memory 110 of FIG. 6 is substantially similar to the solid-state storage media 110 of FIG. 2, described above.

Those of skill in the art will appreciate that the embodiment shown in FIG. 6 is simply one example of an architecture for nonvolatile memory 110 such as flash, and that numerous other architectures are also possible. FIG. 6 shows a simplified version of nonvolatile memory 110 in order to focus on features of the nonvolatile memory 110 in a manner helpful to understanding the present invention. Greater detail on a nonvolatile memory 110 implementation may be found in U.S. patent application Ser. No. 11/952,095 to David Flynn, et al., filed Dec. 6, 2007, entitled "Apparatus, System, and Method for Managing Commands of Solid-State Storage Using Bank Interleave," which is incorporated herein by reference (referred to hereinafter as "The Bank Interleave Application").

As noted above, the terminate module 514 may terminate a non-essential operation identified by the identification module 512 by determining the memory area or component on which the operation is executing, and resetting the memory area or component. As used herein, a memory area or component refers to a physical section of the nonvolatile memory 110 that can be reset with a reset command. A reset command is a command that causes all operations that are executing for the memory area, such as write, erase, and read, to terminate. In one embodiment, each die 636a-f and 656a-f can be independently reset such that each individual die 636a-f and 656a-f constitutes a unique memory area or component. The reset operation causes the operation on the particular die that is the subject of the reset operation to terminate the process.

In certain embodiments, as described herein, the operations occur on a bank basis. For example, an erase operation, in one embodiment, is executed on a logical erase block that spans multiple die that make up a bank. In such embodiments, the memory area or component may be the bank, and the reset operation is sent to all die in the bank at substantially the same time. The reset operation itself may be one command or multiple commands; in such embodiments, each die in the bank is reset, which stops the erase operations for each of the physical erase blocks in each die of the logical erase block.

In another embodiment, the terminate module 514 may reset substantially all of the nonvolatile memory 110 at the same time. For example, in one embodiment, the storage device 102 may schedule erase operations on each bank 630a, 630b, 650a, 650b simultaneously and the terminate module 514 may send reset commands to each bank 630a, 630b, 650a, 650b in the nonvolatile memory 110 to terminate those scheduled erase operations.

In such an embodiment, the terminate module 514 may send a reset command over a bus to a specific die 636a-f or 656a-f. This allows the terminate module 514 to reset the memory areas that are performing non-essential operations (such as an erase) while allowing programming operations (i.e., data storage write operations) on other memory areas to continue. In one embodiment, the terminate module 514 terminates executing operations by issuing a reset signal and terminates pending operations (i.e., those operations in a command queue that have not yet started) by removing the operation from the command queue or otherwise skipping the operations.

Certain non-essential operations may be terminated without the use of a reset command. For example, as noted above, non-essential operations that are in a command queue may simply be skipped by deleting, clearing, marking to prevent execution, or removing the non-essential operations without ever starting them. Since these operations have never started, no die 636a-f or 656a-f needs to be reset to terminate the operation. Other non-essential operations that are not executed on the die 636a-f and 656a-f may similarly be terminated without a reset command even when they are executing; for example, if a stage in the write data pipeline 106 is generating a hash key for the data when the power disruption is detected, the hash generation operation may be terminated without a reset operation being sent to the die 636a-f and 656a-f. In certain embodiments, only program/write, read, and erase operations that are in the process of executing on a particular die 636a-f and 656a-f are terminated with the reset command.

In certain embodiments, the terminate module 514 may quiesce or otherwise shut down particular areas/sections/modules/subcomponents of the storage device 102. For example, the terminate module 514 may shut down all physical devices/components and/or logical modules that implement the read data pipeline 108. In a further embodiment, the terminate module 514 may quiesce or otherwise shut down a read DMA engine, or other subcomponents associated with non-essential operations. The terminate module 514 may also shut down one or more CPUs operating on the storage device 102; for example, the storage device 102 may have a multi-core CPU. In such an embodiment, the terminate module 514 may shut down one or more cores on the CPU that the power management apparatus 122 is not using.

The terminate module 514 may also monitor and ensure that no activity unrelated to the operations of the power management apparatus 122 is occurring on the core that is supporting the power management apparatus 122. In certain embodiments, the power management apparatus 122 may be implemented in hardware separate from the CPU such that the terminate module 514 may simply shut down the CPU (or CPUs) to preserve power. The terminate module 514 may shut down the read data pipeline 108 and the CPU by stopping the respective clocks. Those of skill in the art will appreciate other approaches to shutting down the read data pipeline 108, the read DMA engine, the CPU, and/or other subcomponents of the storage device 102.

In certain embodiments, as described in the Bank Interleave Application, certain operations may occur on a bank level; for example, data is programmed (i.e. written or stored) to the die 636a, 636c, and 636e during a program operation that affects the bank 630a. The banks 630a-b and 650a-b may be organized such that they provide logical erase blocks (made up of n number of physical erase blocks when there are n die in the banks), logical pages (made up of N number of physical erase blocks when there are N die in the banks), and so on. Thus, in FIG. 6, the bank 630a may present a logical erase block that is made up of three physical erase blocks (from die 636a, 636c, and 636e), and logical pages of data made up of three physical pages from die 636a, 636c, and 636e.

In such an embodiment, the terminate module 514 may send the reset command over the bus to the die (such as die 636a, 636c, and 636e) that are running in parallel in the bank 630a. In such an embodiment, the group of die 636a, 636c, and 636e would be reset simultaneously, effectively halting the operations occurring on each of the die 636a, 636c, and 636e. Thus, since an erase operation occurs on a logical erase block that includes physical erase blocks on the three physical die 636a, 636c, and 636e, the reset operation may be physically sent to the three physical erase blocks on the die 636a, 636c, and 636e simultaneously to halt the erase operation that is in process for the logical erase block. Similarly, in a further embodiment, the terminate module 514 may send the reset operation to all the dies 636a-f, 656a-f to reset the entire nonvolatile memory 110 simultaneously.

In one possible example, the monitor module 510 may determine that the storage device 102 has lost power. The identification module 512 determines that there is an erase operation occurring on the nonvolatile memory 110 against a logical erase block on bank 650a. The terminate module 514 sends a reset command to the bank 650a, which causes the die 656a, 656c, and 656e to reset and thus terminates the erase operation. A similar pattern may occur for other erase operations and read operations pending for the nonvolatile memory 110 after the storage device 102 loses power. In addition, the banks may be independent of one another such that operations occurring on one bank can be terminated or paused without affecting the operations on the other banks in the storage device 102.

In certain embodiments, the program, erase, and read operations do not occur on a bank level as described above; in certain architectures, the program, erase, and read operations occur individually on each die 636a-f and 656a-f. In such embodiments, the reset operation may be sent to the affected die; for example, an erase of a physical erase block on die 636b may be terminated by the terminate module 514 sending a reset command to the die 636b.

Other approaches may be taken to terminate non-essential operations that are executing as identified by the identification module 512. In one embodiment, the terminate module 514 terminates the non-essential operations that are executing or are queued to execute by pausing the non-essential operation. Certain nonvolatile memory devices 110 may allow executing operations to be paused. In such embodiments, the terminate module 514 may send a command to pause the non-essential operations without sending a subsequent command to resume the non-essential operations, effectively causing the operation to cancel. In other embodiments, the terminate module 514 may send a command to pause the non-essential operations, wait until all essential program operations are complete, and then send one or more resume commands to the various paused operations.

Figure 7:
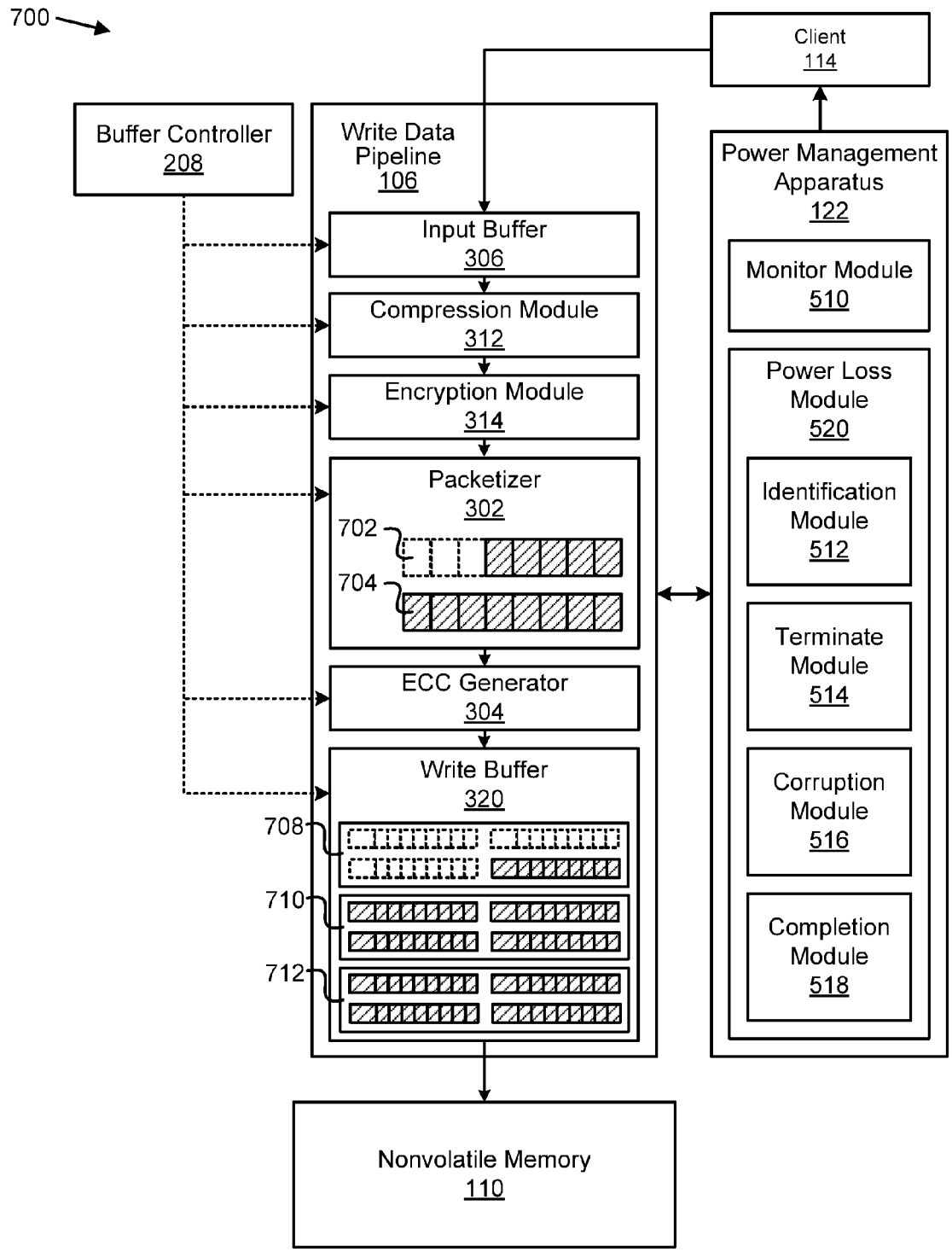
FIG. 7 is a schematic block diagram illustrating one embodiment of a write data pipeline.

FIG. 7 shows one embodiment 700 of a power management apparatus 122 and a write data pipeline 106 for a storage device 102. In one embodiment, the write data pipeline 106 is substantially similar to the write data pipeline 106 described above with regard to FIG. 3. In the depicted embodiment 700, the write data pipeline 106 includes an input buffer 306, a compression module 312, an encryption module 314, a packetizer 302, an ECC generator 304, and a write buffer 320. In other embodiments, the write data pipeline 106 may include other stages or modules, such as a write program module 310, a garbage collector bypass 316, a media encryption module 318, a write synchronization buffer 308, and/or other stages.

As shown in FIG. 3, the write data pipeline 106 may be implemented as part of a solid state storage (SSS) controller 104. The power management apparatus 122, in one embodiment, may also be implemented as part of the SSS controller 104. In one embodiment, the power management apparatus 122 may be implemented separately, but be in communication with the SSS controller 104. The power management apparatus 122, in a further embodiment, may be integrated with the SSS controller 104.

As discussed above, the corruption module 516, in certain embodiments, identifies data received over the PCI-e connection (or other connection, depending on the implementation) that was received after the power disruption and that is presumed corrupted (generally referred to hereafter as corrupt data). The corruption module 516, in one embodiment, also ensures that the client 114 can or should know that the data presumed corrupted was not saved in the storage device 102. In one embodiment, the corruption module 516 determines the location of the oldest piece of corrupt data in the write data pipeline 106. The oldest piece of corrupt data is at the start of the data received after the corruption period begins. All data from the oldest piece of corrupt data back to the beginning of the write data pipeline 106 (for example, the input buffer 306) is presumed to be corrupt and is removed from the write data pipeline 106.

In one embodiment, the corruption module 516 may cause the storage device 102 to delay sending the acknowledgment back to the client 114 until after the period of time used to calculate the corruption time has passed. As discussed above, in certain embodiments depending on the architecture of the storage device 102 and of the write data pipeline 106, the corruption module 516 may assume that all data received 5 microseconds or later after the monitor module 510 detects the power disruption is corrupt. Thus, the 5 microseconds is the period of time used to calculate the corruption time. Thus, the corruption module 516 may specify that the acknowledgement is not to be sent to the client 114 until 5 microseconds after the data was received by the storage device 102. As a result, in certain embodiments, data is never acknowledged as having been stored until the storage device 102 can guarantee that the data was not corrupted by a power disruption that has not yet been detected and/or communicated to the storage device 102.

In one embodiment, the corruption module 516 sends the acknowledgement once data leaves a buffer that is managed by the buffer controller 208, but prior to the data entering the write data pipeline 106. For example, data may be transferred by a direct memory access ("DMA") engine into buffers on the storage device 102, and that data is then moved by one or more buffer controllers 208 into the write data pipeline 106.

In one embodiment, the buffer controller 208 allows the buffer receiving the data from the DMA engine to fill, waits for expiration of the corruption time, and then sends an acknowledgement to the client 114. Once the period of time passes after the buffer is filled, it is known whether or not a power disruption has corrupted all or part of the data in the buffer and the data may be safely acknowledged. If a power disruption has occurred, the data can be removed from the buffer without being sent to the write data pipeline 106. In addition, no acknowledgement may be sent to the client 114 acknowledging that the data was stored, if a power disruption has occurred. According to best practices, the client 114 should therefore assume that the data was not stored. In another embodiment, the potential risk of data corruption in the write data pipeline 106 is acceptable and so the buffer controller 208 allows the buffer to fill, no delay is imposed for the corruption time, and then the storage device 102 sends an acknowledgement to the client 114. In certain embodiments, the storage device 102 inserts the corruption avoidance delay by default and is configurable to allow for not inserting the corruption avoidance delay.

As a result, in such an embodiment, the corruption module 516 can prevent data corrupted by a power disruption from entering the write data pipeline 106 and further prevent the storage device 102 from sending an acknowledgement until after the storage device 102 can assure that the data was not corrupted during a power disruption.

In another embodiment, the corruption module 516 stops corrupted data within the write data pipeline 106 at a choke point. The choke point is the location in the write data pipeline 106 where, in the event a power disruption is detected, any data above the choke point (i.e., between the choke point and the input buffer 306, including data in the input buffer 306) is presumed to be corrupted. The location of the choke point may be determined by the rate at which data travels through the write data pipeline 106 and also on the period of time used to determine the corruption time. For example, the corruption module 516 may assume that, in the 5 microseconds since the corruption time, the farthest data may have moved into the write data pipeline 106 is to the ECC generator 304. Thus, the ECC generator 304, in the example embodiment, is the choke point in the write data pipeline 106. In the event that a power disruption is detected, the corruption module 516 may prevent data within the ECC generator 304 and any data farther up the write data pipeline (i.e., in the media encryption module 314, the packetizer 302, and so on up the write data pipeline 106) from moving through the write data pipeline 106 and into the nonvolatile memory 110. In certain embodiments, the corruption module 516 aborts the operations occurring in the write data pipeline 106 above the choke point.

In a further embodiment, the location of the choke point may be determined by the location at which the write data pipeline 106 has enough information to write data to the nonvolatile memory 110. For example, in one embodiment, once the packetizer 302 has added header metadata to a complete packet, the write data pipeline 106 has enough information to further process the packet (i.e. pass the packet to the ECC generator 304, etc.) and to write the packet to the nonvolatile memory 110. A packet, in one embodiment, is the smallest writable unit of data in the write data pipeline 106. In this example embodiment, the packetizer 302 is the choke point. In a further embodiment, an ECC chunk or codeword is the smallest writable unit of data in the write data pipeline 106, and the ECC generator 304 may be the choke point. In one embodiment, characteristics of the secondary power supply 124 are selected to provide a power hold-up time sufficiently long enough for data to pass through the write data pipeline 106 from the choke point on and to be written to the nonvolatile memory 110.

In certain embodiments, the corruption module 516 sends an acknowledgement for the data once the data has moved completely through the choke point in the write data pipeline 106. Thus, the corrupt data may be stopped, and the operations working on the corrupt data aborted, before the acknowledgement is sent. As a result, the client 114 is not given an acknowledgement until the data that is stored or in the pipeline to be stored is good, uncorrupt data.

In certain embodiments, the data may be organized into atomic data units. For example, the atomic data unit may be a packet, a page, a logical page, a logical packet, a block, a logical block, a set of data associated with one or more logical block addresses (the logical block addresses may be contiguous or noncontiguous), a file, a document, or other grouping of related data. In such embodiments, the corruption module 516 may delay sending the acknowledgement until the entire atomic data unit has passed through the choke point. For example, part of a file may have passed through the choke point and is thus known to be uncorrupt data; however, the last half of the file has not yet passed through the choke point and thus may include corrupt data. The corruption module 516 may wait until the entire atomic data unit has passed through the choke point before sending the acknowledgement, as opposed to sending an acknowledgment when only a portion of the atomic data unit has moved through. In one embodiment, the corruption module 516 discards partially corrupted atomic data units. In a further embodiment, the corruption module 516 allows an uncorrupted portion of an atomic data unit, or both an uncorrupted portion and a corrupted portion of an atomic data unit, to pass through the write data pipeline 106 and to be written to the nonvolatile memory 110. In certain embodiments, where an atomic data unit may include partial data or data that is corrupted, the power management apparatus 122 may include an indicator with the stored data to indicate the proper state of the atomic data unit.

The corruption module 516 may further be responsible for halting the flow of data into the write data pipeline 106 after a power disruption is detected. Thus, regardless of whether the corrupted data is handled outside the write data pipeline 106 or within the write data pipeline 106, the corruption module 516 may prevent any data from entering the write data pipeline 106 after the power disruption is detected.

The completion module 518 may also work in conjunction with the write data pipeline 106 to ensure that data that is not corrupt and has been acknowledged is moved through the write data pipeline 106 and stored in the nonvolatile memory 110. The modules/stages in the write data pipeline 106 may use buffers to support their operations. In certain embodiments, the modules (such as modules 302-314) only perform the operations once the relevant buffer is filled. For example, the ECC generator 304 may wait until the buffer is full and then generate an ECC value for the entire buffer. In one embodiment, the buffer controller 208 manages the flow of data through buffers in the write data pipeline 106. Similarly, the write data pipeline 106 may include one or more control queues 342 for stages in the write data pipeline 106, as described above with regard to FIG. 3.

During normal operation, the write data pipeline 106 continually streams data through the write data pipeline 106 such that the buffers will always be filled. However, in the event of a power disruption, data flow into the write data pipeline 106 may be stopped when one or more buffers in the write data pipeline 106 are only partially full. For example, as noted above, the corruption module 516 may remove corrupt data from the write data pipeline 106 and prevent new data from flowing into the storage device 102. As a result, one or more buffers in the write data pipeline 106 may be left partially full.

If the data is not moved through the write data pipeline 106, the data will be lost at the end of the power hold-up time once the secondary power supply 124 is exhausted.

In certain embodiments, the completion module 518 flushes data through partially filled buffers in the write data pipeline 106 during the power loss mode. The completion module 518, in one embodiment, fills the partially filled buffers with padding data. In other embodiments, as described above, the completion module 518 may flush data without adding padding data by using existing values stored in the unfilled portion of the buffer as padding data, or the like. As a result, the data and the padding are operated on, moved out of the buffer, and moved through the write data pipeline 106. The buffers used in the write data pipeline 106 may not all be the same size; in such embodiments, the completion module 518 may monitor the data as the data moves through the write data pipeline 106 and flush additional buffers at any point where a buffer is partially filled.

In certain embodiments, the completion module 518 uses a unique marker, indicator, or header, to identify the padding data to prevent the padding data from being mistaken for actual data in the future. In certain embodiments, the pad sequence is made up of 1 values as the value "1" is the state the nonvolatile memory 110 cells are in prior to the program of the cells occurring. For example, in Flash memory, the program operations convert 1s to 0s. By using a pad sequence made up of 1s, the power necessary to convert 1s to 0s may be conserved. In a related embodiment, the is making up the pad data do not need to be transferred prior to initiating a program operation as the cells will already be in the 1 state.

In certain embodiments, as data is moved out of the write data pipeline 106, over the storage I/O bus 210, and into nonvolatile memory 110, an indicator is inserted in the packet indicating whether or not the data was properly written. In certain embodiments, the indicator is inserted in the header of a packet for the data and indicates whether the data in the packet that preceded the packet with the indicator was properly written. Thus, if a packet is successfully programmed, the header of the subsequent packet is programmed with an indicator stating that the last packet programmed was successfully programmed.

In other embodiments, the indicator is placed at the end of the packet in a footer and indicates whether the packet in which the indicator is contained was properly written. In one embodiment, this is done by shifting the data forward one bit such that the data encroaches into the header space. Thus, if the header is a 64-bit header, the shift reduces the header space to 63-bits and adds one bit to the footer. This leaves one bit at the end of the packet which may be used as the indicator. This approach allows each packet to indicate its own status while maintaining proper alignment, in embodiments that may be sensitive to boundary alignment.

The indicator may be used to identify that the packet includes padding and that the data is therefore incomplete and may not be usable by the system. In certain embodiments, when the storage device 102 is powered on again after the failure, the indicator is used to aid in reconstruction of the indexes and the validity map for the nonvolatile memory 110.

In certain embodiments, one indicator is inserted for each atomic data unit. As noted above, the indicator may be placed as a footer at the end of the last packet in the atomic data unit. The indicator may thus indicate whether the data for the entire atomic data unit was properly written. If, for example, the power disruption causes only a portion of the atomic data unit to be written, and the last packet was padded as described above, the indicator would indicate that the entire atomic data unit was not properly written. In addition, as discussed above, in certain embodiments, no acknowledgement would have been sent to the client 114, in certain embodiments.

In one embodiment, corrupt data is allowed to progress through the write data pipeline 106 in order to flush acknowledged good data in progress to the nonvolatile memory 110. The corrupt data may be identified by setting the indicator as described above, which indicator flags the data as invalid/corrupt. In related embodiments, other forms of indicators such as specialized packets, headers, unique character streams, markers and similar methods known to those skilled in the art may be substituted for the indicator described above to invalidate the corrupt data stored in the nonvolatile memory 110. In all such cases, the corrupt data should never be acknowledged to the client 114.

As described above with regard to FIG. 5, the completion module 518, in one embodiment, uses a unique header, footer, token, marker, pattern, or other identifier to identify that the power management apparatus 122 has successfully completed the essential operations in the power loss mode, such as successfully flushing write data through the write data pipeline 106 or the like and successfully storing the data on the nonvolatile memory 110 during the power hold-up time. The indicator, in one embodiment, is the same indicator described above to identify corrupt data, padding data, or the like. In a further embodiment, the completion module 518 uses a separate indicator to identify successful execution of essential operations during the power loss mode.

In one embodiment, an atomic data unit is associated with a plurality of noncontiguous and/or out of order logical block addresses or other identifiers that the write data pipeline 106 handles as a single atomic data unit. As used herein, writing noncontiguous and/or out of order logical blocks in a single write operation is referred to as an atomic write. In one embodiment, a hardware controller processes operations in the order received and a software driver of the client 114 sends the operations to the hardware controller for a single atomic write together so that the write data pipeline 106 can process the atomic write operation as normal. Because the hardware processes operations in order, this guarantees that the different logical block addresses or other identifiers for a given atomic write travel through the write data pipeline 106 together to the nonvolatile memory 110. In one embodiment, because the terminate module 514 does not terminate acknowledged write operations, acknowledged atomic writes are successfully stored in the nonvolatile memory 110 and the client 114 can detect that an atomic write has failed, due to a power loss or the like, if the client 114 does not receive an acknowledgment. The client 114, in one embodiment, can back out, reprocess, or otherwise handle failed atomic writes and/or other failed or terminated operations upon recovery once power has been restored.

In one embodiment, a software driver on the client 114 may mark blocks of an atomic write with a metadata flag indicating whether a particular block is part of an atomic write. One example metadata marking is to rely on the log write/append only protocol of the nonvolatile memory 110 together with a metadata flag, or the like. The use of an append only log for storing data and prevention of any interleaving blocks enables the atomic write membership metadata to be a single bit. In one embodiment, the flag bit may be a 0, unless the block is a member of an atomic write, and then the bit may be a 1, or vice versa. If the block is a member of an atomic write and is the last block of the atomic write, in one embodiment, the metadata flag may be a 0 to indicate that the block is the last block of the atomic write. In another embodiment, different hardware commands may be sent to mark different headers for an atomic write, such as first block in an atomic write, middle member blocks of an atomic write, tail of an atomic write, or the like.

On recovery from a power loss or other failure of the client 114 or of the storage device 102, in one embodiment, the storage controller 104, the power management apparatus 122, or the like scans the log on the nonvolatile memory 110 in a deterministic direction (for example, in one embodiment the start of the log is the tail and the end of the log is the head and data is always added at the head). In one embodiment, the power management apparatus 122 scans from the head of the log toward the tail of the log. In other embodiments, the power management apparatus 122 may scan from the tail of the log toward the head of the log, scan once from tail to head and once from head to tail, or otherwise scan the log for recovery purposes. For atomic write recovery, in one embodiment, when scanning head to tail, if the metadata flag bit is a 0, then the block is either a single block atomic write or a non-atomic write block. In one embodiment, once the metadata flag bit changes from 0 to 1, the previous block scanned and potentially the current block scanned are members of an atomic write. The power management apparatus 122, in one embodiment, continues scanning the log until the metadata flag changes back to a 0, at that point in the log, the previous block scanned is the last member of the atomic write and the first block stored for the atomic write.

In one embodiment, the nonvolatile memory 110 uses a log-based, append only write structured writing system where new writes go on the front of the log (i.e. at the head of the log). In a further embodiment, the storage controller 104 reclaims deleted, stale, and/or invalid blocks of the log using a garbage collection system, a groomer, a cleaner agent, or the like. The storage controller 104, in a further embodiment, uses a forward map to map logical block addresses to physical addresses to facilitate use of the append only write structure and garbage collection.

The storage controller 104, in a further embodiment, tracks write operations in process during normal operation of the storage device 102 using a data structure such as an in-flight tree, or the like. An inflight tree, in one embodiment, is a data structure that maintains a record of block storage requests (in particular write requests) that have been received by the storage device 102 but have not yet been completed. The power management apparatus 122, in one embodiment, ensures that for a single block write, the write is guaranteed to complete even if power is lost.

In the depicted embodiment 700, the packetizer 302 includes an incomplete packet 702 and a complete packet 704. In one embodiment, if the incomplete packet 702 is at the end of an atomic data unit, the corruption module 516 may send an acknowledgment for the data in the incomplete packet 702 and the complete packet 704 to the client 114. During power loss mode, in one embodiment, the completion module 518 flushes the incomplete packet 702 from the packetizer 302. As described above, in certain embodiments, the completion module 518 may add a marker indicating the end of valid data in the incomplete packet 702, add padding data to the packet 702, and/or otherwise flush the incomplete packet 702 from the packetizer 302.

In another embodiment, if the complete packet 704 is at the end of an atomic data unit and the incomplete packet 702 is from an incomplete different atomic data unit, the corruption module 516 sends an acknowledgment to the client 114 for the data in the complete packet 704, but does not acknowledge the data of the incomplete packet 702 to the client 114. During power loss mode, in one embodiment, the terminate module 514 may discard the incomplete packet 702 as unacknowledged data, skip one or more operations relating to the incomplete packet 702 as non-essential operations, or the like.

In the depicted embodiment, the write buffer 320 includes one incomplete page 708 and two complete pages 710, 712. In one embodiment, the pages 708, 710, 712 comprise logical pages, as described above. The completion module 518, in one embodiment, flushes one or both of the packets 702, 704 from the packetizer 302, through the ECC generator 304, and to the write buffer 320 during the power loss mode.

In one embodiment, the write buffer 320 writes the complete pages 710, 712 to the nonvolatile memory 110 substantially as normal, even during the power loss mode. In a further embodiment, the terminate module 514 may terminate and/or reset one or more non-essential operations on the nonvolatile memory 110 so that the write buffer 320 can write the complete pages 710, 712 to the nonvolatile memory 110. The completion module 518, in one embodiment, flushes the incomplete page 708 from the write buffer 320 to the nonvolatile memory 110 so that the nonvolatile memory 110 stores the incomplete page 708 within the power hold-up time. As described above, in various embodiments, the completion module 518 may add a marker indicating the end of valid data in the incomplete page 708, add padding data to the incomplete page 708, and/or otherwise flush the incomplete page 708 from the write buffer 320.

Figure 8:
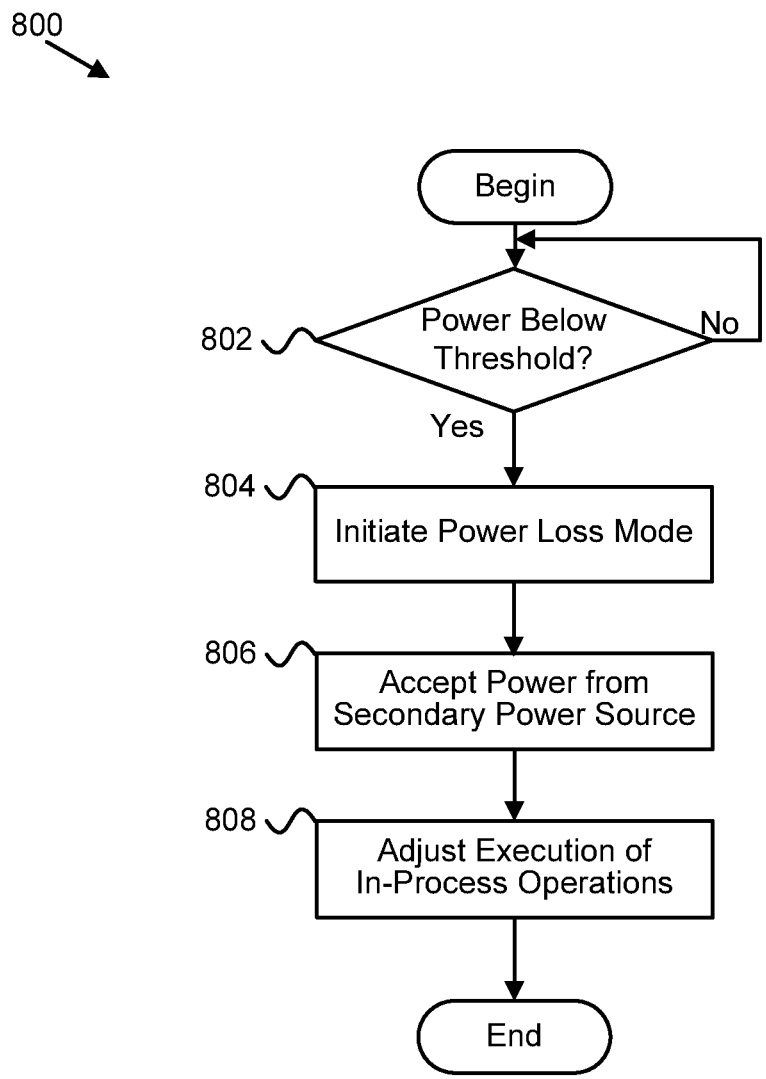
FIG. 8 is a schematic flow chart diagram illustrating one embodiment of a method for improved data handling in the event of an unexpected power failure.

FIG. 8 depicts one embodiment of a method 800 for power loss management in a storage device 102. The method 800 begins, and the monitor module 510 determines 802 whether power from the primary power connection 130 is below the predefined threshold. In the depicted embodiment, if the monitor module 510 determines 802 that power from the primary power connection 130 is not below the predefined threshold, the monitor module 510 continues to monitor 802 the amount of power from the primary power connection 130.

In the depicted embodiment, if the monitor module 510 determines 802 that power from the primary power connection 130 is below the predefined threshold, the monitor module 510 initiates 804 a power loss mode in the storage device 102. The storage device 102 accepts 806 power from the secondary power source 124 for at least a power hold-up time during the power loss mode. The power loss module 520, in the depicted embodiment, adjusts 808 execution of in-process operations on the storage device 102 during the power loss mode so that essential in-process operations execute within the power hold-up time, and the method 800 ends.

Figure 9:
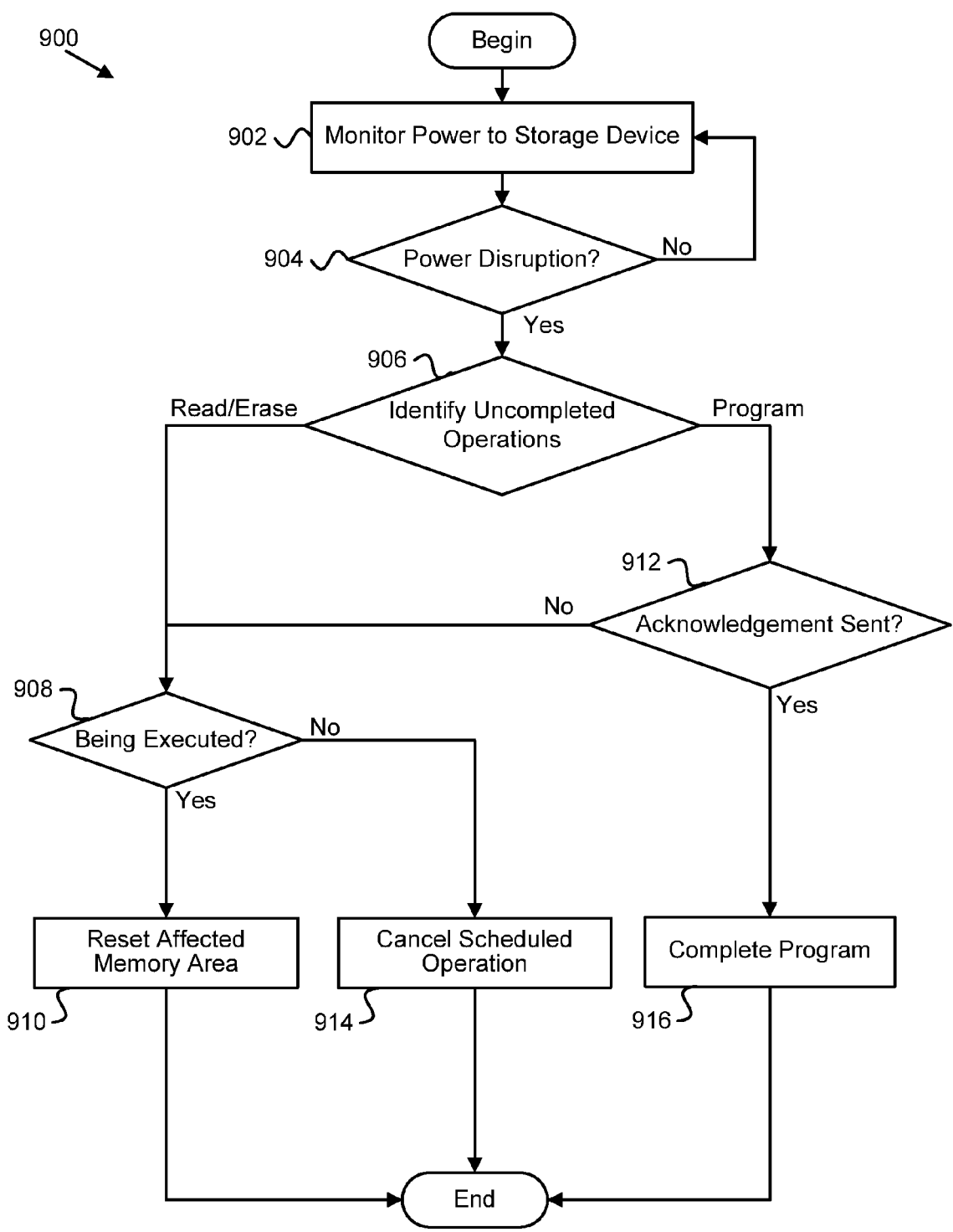
FIG. 9 is a schematic flow chart diagram illustrating another embodiment of a method for improved data handling in the event of an unexpected power failure.

FIG. 9 shows one embodiment of a method 900 for improved storage device operation during a power failure. The method 900 begins with monitoring 902 the power to the storage device 102. In one embodiment, the monitor module 510 monitors the power to the storage device 102. The method 900 also includes determining 904 whether the power to the storage device 102 has been interrupted, falls below a predefined threshold, or the like.

If the power to the storage device 102 has not been interrupted, the monitor module 510 continues monitoring the power to the storage device 102 for interruptions. In the event of an interruption, the method includes identifying 906 the uncompleted operations on the storage device 102. In one embodiment, the identification module 512 identifies 906 the uncompleted operations. In certain embodiments, the identification module 512 deals with only erase operations, read operations, and program operations. In certain embodiments, other types of operations are also identified.

In the embodiment shown, if the uncompleted operations are read or erase operations, the identification module 512 may determine 908 which read operations and erase operations are currently being executed (i.e., those that are currently occurring on the nonvolatile memory 110) and those that are pending. For those read and erase operations that are currently being executed, in one embodiment, the terminate module 514 sends a reset command to reset 910 the affected memory area and cancel the relevant operation. As discussed above, the terminate module 514 may perform these actions according to a priority system, and may also alternatively choose to allow certain operations that are near completion to complete.

If the uncompleted read/erase operations are not currently being executed, the terminate module 514 may simply cause the operations to be canceled 914 or otherwise skipped. For example, the operations may be queued in one or more command queues and awaiting execution. The terminate module 514 may remove read and erase operations from the queue such that they are not executed. The terminate module 514 may alternatively cause the operations to be ignored or skipped; that is, the operations may be left in the queue but not selected for execution. In a further embodiment, the terminate module 514 may ignore one or more non-essential command queues that hold non-essential operations, and select operations for execution from one or more essential command queues that hold essential operations, or the like.

If the uncompleted operation is a program operation, the identification module 512 may determine 912 whether or not an acknowledgement has been sent to the client 114. If the acknowledgement has not been sent, the terminate module 514 may choose to cancel the queued operation or reset the affect memory area as described above. In other embodiments, program operations may be allowed to complete if they are in the storage device 102 regardless of whether or not an acknowledgement has been sent.

If an acknowledgement has been sent, the program operation is allowed 916 to complete. As a result, the data associated with the program operation is moved into nonvolatile memory 110 as reported to the client 114. As discussed above, the corruption module 516 may purge corrupt data from the data write pipeline 106 as part of the method 900. Similarly, the completion module 518 may flush partially filled buffers to ensure that data to be programmed is moved through the data write pipeline 106. As discussed above, the corruption module 516 and/or the completion module 518 may cause an indicator to be set which identifies the corrupt data to the storage device 102.

By reducing the number of operations to be executed by a nonvolatile storage device 102 during a power failure, the size, cost, and complexity of the secondary power supply 124 can be reduced. In certain embodiments, the focus is placed on particularly power hungry/expensive operations such as erases that are less critical but consume considerable power. The system 100 may further distinguish between essential programs (those for which an acknowledgement has been sent to the client 114) and non-essential programs (those for which no acknowledgement has been sent).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for power reduction management, the method comprising:

determining that a power source has failed to supply electric power above a predefined threshold;

terminating one or more non-essential in-process operations on a nonvolatile memory device during a power hold-up time; and executing one or more essential in-process operations on the nonvolatile memory device within the power hold-up time.

2. The method of claim 1, further comprising accepting electric power for the nonvolatile memory device from a secondary power source for at least the power hold-up time.

3. The method of claim 1, further comprising prioritizing in-process operations for the nonvolatile memory device, wherein the one or more essential in-process operations have a higher priority than the one or more non-essential in-process operations.

4. The method of claim 3, further comprising reordering the in-process operations and executing the in-process operations in order of priority such that the one or more essential in-process operations are executed within the power hold-up time and the one or more non-essential in-process operations are not executed.

5. The method of claim 3, wherein the one or more non-essential in-process operations are terminated in order of priority beginning with a lowest priority in-process operation and proceeding toward the one or more essential in-process operations without terminating the one or more essential in-process operations.

6. The method of claim 3, wherein the in-process operations are prioritized based on one or more of an amount of remaining power, an amount of power required to complete an operation, a percentage of an operation that has completed, an execution importance of an operation, and whether an operation has been acknowledged.

7. The method of claim 1, wherein the one or more non-essential in-process operations comprise one or more of an un-acknowledged write operations, an erase operation, and a read operation.

8. The method of claim 1, further comprising powering off the nonvolatile memory device without executing the one or more non-essential in-process operations.

9. The method of claim 1, wherein terminating the one or more non-essential in-process operations comprises skipping the one or more non-essential in-process operations in one or more command queues such that the one or more non-essential in-process operations are not performed on the non-volatile memory device.

10. The method of claim 1, wherein the one or more essential in-process operations comprise one or more write operations that have been acknowledged to one or more clients of the nonvolatile memory device.

11. The method of claim 1, wherein terminating the one or more non-essential in-process operations comprises resetting one or more nonvolatile memory components of the nonvolatile memory device.

12. The method of claim 11, wherein the essential in-process operations are executed on the one or more nonvolatile memory components in response to resetting the one or more nonvolatile memory components.

13. The method of claim 11, wherein the one or more nonvolatile memory components comprise one or more banks of nonvolatile memory components currently processing the one or more non-essential in-process operations, each bank comprising a plurality of nonvolatile memory dies.

14. The method of claim 1, further comprising quiescing operation of one or more subcomponents of the nonvolatile memory device in response to determining that the power source has failed to supply electric power above the predefined threshold.

15. The method of claim 1, wherein executing the one or more essential in-process operations comprises flushing buffered incomplete data associated with the one or more essential in-process operations to nonvolatile memory of the nonvolatile memory device such that the nonvolatile memory stores the buffered incomplete data within the power hold-up time.

16. An apparatus for power reduction management, the apparatus comprising:
a monitor module configured to determine that a power source has failed to supply electric power above a predefined threshold to a nonvolatile storage device;
an identification module configured to determine a prioritization of in-process operations for the nonvolatile storage device; and
a termination module configured to terminate one or more in-process operations based on the prioritization of in-process operations such that one or more essential in-process operations execute within a power hold-up time for the nonvolatile storage device.

17. The apparatus of claim 16, further comprising a corruption module configured to discard data received during a corruption period occurring prior to the monitor module determining that the power source has failed to supply electric power above the predefined threshold.

18. The apparatus of claim 17, wherein the corruption module is configured to halt a flow of data into a write data pipeline for the nonvolatile storage device in response to the monitor module determining that the power source has failed to supply electric power above the predefined threshold.

19. A system for power reduction management, the system comprising:
a nonvolatile data storage device comprising a plurality of nonvolatile memory components;
a monitor module configured to determine that a primary power source has failed to supply electric power above a predefined threshold to the nonvolatile data storage device;
a termination module configured to reset one or more of the plurality of nonvolatile memory components executing non-essential in-process operations such that one or more essential in-process operations execute on the one or more nonvolatile memory components within a power hold-up time.

20. The system of claim 19, further comprising a secondary power source configured to supply electric power to the nonvolatile data storage device for at least the power hold-up time.

21. A computer program product comprising a computer readable storage medium storing computer usable program code executable to perform operations for power reduction management, the operations comprising:
initiating a power loss mode in a nonvolatile memory device in response to a power source failing to supply electric power above a predefined threshold;
interrupting one or more in-process erase operations executing on one or more nonvolatile memory components of the nonvolatile memory device during the power loss mode; and
executing one or more pending write operations on the one or more nonvolatile memory components in response to interrupting the one or more in-process erase operations such that the one or more pending write operations complete within a power hold-up time.

22. The computer program product of claim 21, wherein the operations further comprise quiescing operation of one or more subcomponents of the nonvolatile memory device in response to initiating the power loss mode.

23. The computer program product of claim 21, wherein the operations further comprise discarding data received during a corruption period occurring prior to initiating the power loss mode.

24. An apparatus for power reduction management, the apparatus comprising:
- means for determining that a primary power source has failed to supply electric power above a predefined threshold to a nonvolatile data storage device;
- means for providing secondary electric power for the nonvolatile data storage device for at least a power hold up time; and
- means for adjusting execution of operations on the nonvolatile data storage device such that one or more essential operations execute on the nonvolatile data storage device within the power hold up time.

25. The apparatus of claim 24, further comprising means for terminating one or more non-essential operations on the nonvolatile data storage during the power hold up time.

* * * * *